United States Patent [19]
Smith

[11] Patent Number: 5,704,489
[45] Date of Patent: Jan. 6, 1998

[54] SIMM/DIMM BOARD HANDLER

[76] Inventor: Paul E. Smith, 17511 Meredith Dr., Santa Ana, Calif. 92705

[21] Appl. No.: 782,606

[22] Filed: Jan. 13, 1997

[51] Int. Cl.$^6$ ........................................................ B03B 9/00
[52] U.S. Cl. ........................... 209/2; 209/573; 209/655; 209/909; 209/911; 209/916; 209/924
[58] Field of Search ............................... 209/573, 571, 209/655, 2, 909, 910, 911, 916, 924

[56] References Cited

U.S. PATENT DOCUMENTS

| | | | |
|---|---|---|---|
| 3,776,675 | 12/1973 | Veneria | 209/655 X |
| 4,804,078 | 2/1989 | Scata | 209/924 X |
| 5,184,068 | 2/1993 | Twigg et al. | 209/573 X |
| 5,611,436 | 3/1997 | Ashby | 209/573 |

OTHER PUBLICATIONS

One page brochure of Exatron, Automatic Memory–Module Handler.
One page brochure of Integrated Test Systems, Product Brief, Excel 828 SIMM/DIMM Handler.
One page brochure of MC Systems, Inc., Model 838–DIM, Dual In–Line Memory Module Handler.
One page brochure of MC Systems, Inc., Model 818–SIM, Single In–Line Memory Module Handler.
One page brochure of CST, "We Take A Hands Off Approach To Simms Testing".

*Primary Examiner*—David H. Bollinger
*Attorney, Agent, or Firm*—Stetina Brunda Garred & Brucker

[57] ABSTRACT

A circuit board handling and testing apparatus comprising a housing which defines a top surface. Attached to the housing is a magazine assembly which accommodates a plurality of circuit boards and is adapted to dispense the circuit boards onto a testing assembly attached to the housing one at a time. Each of the circuit boards stored within the magazine assembly defines a longitudinal axis. The testing assembly includes a modular testing component for receiving the circuit board dispensed onto the testing assembly and performing a testing protocol thereon. A reciprocal transport assembly attached to the housing pushes the circuit board dispensed onto the testing assembly laterally relative to its longitudinal axis into the modular testing component of the testing assembly. A sorting assembly which is also attached to the housing selectively directs the tested circuit board into a particular containment vessel based upon the outcome of the testing protocol. The testing assembly is adapted to eject the circuit board into the sorting assembly subsequent to the completion of the testing protocol, with the modular testing component being selectively removable from the testing assembly and replaceable with an alternative modular testing component.

27 Claims, 7 Drawing Sheets

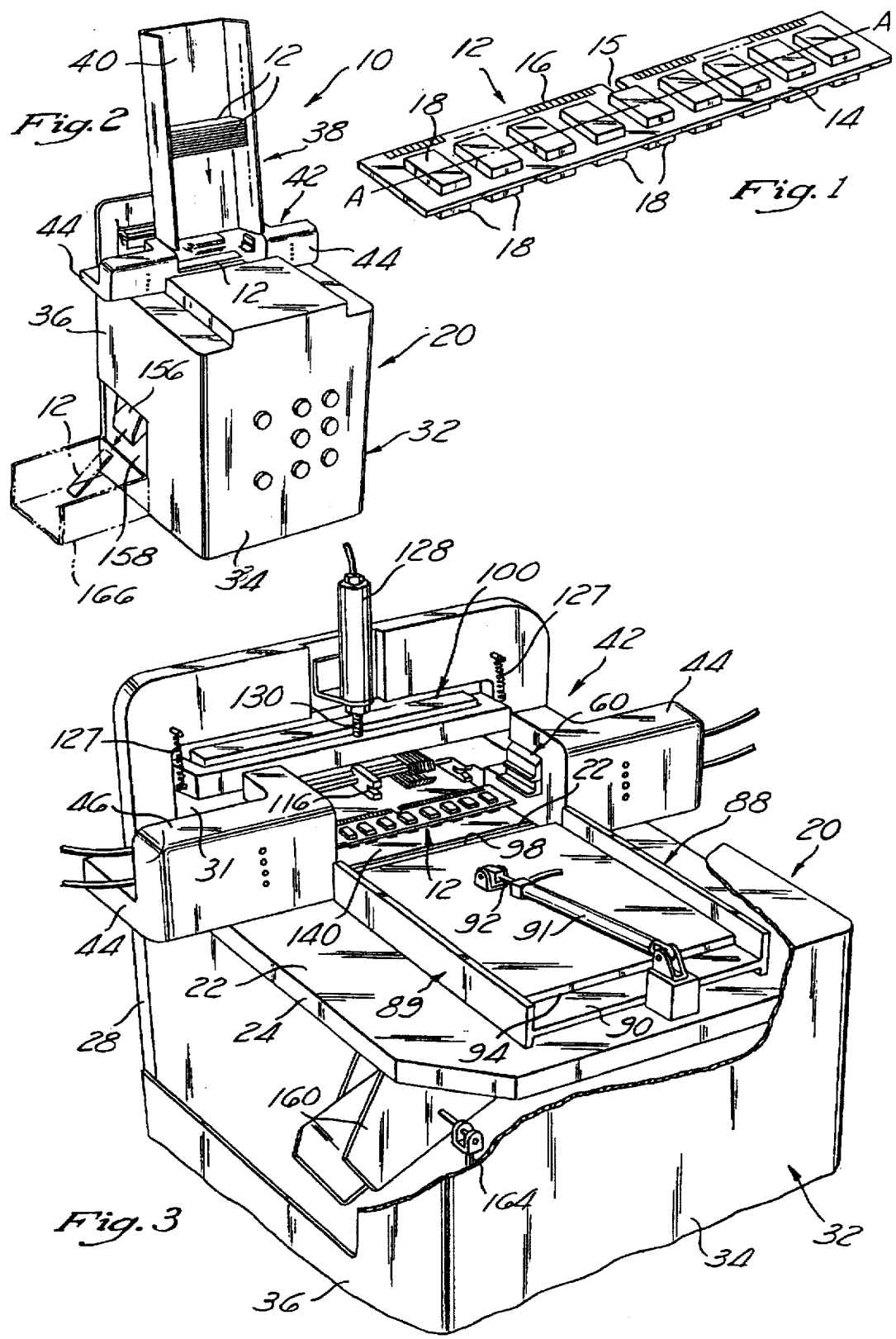

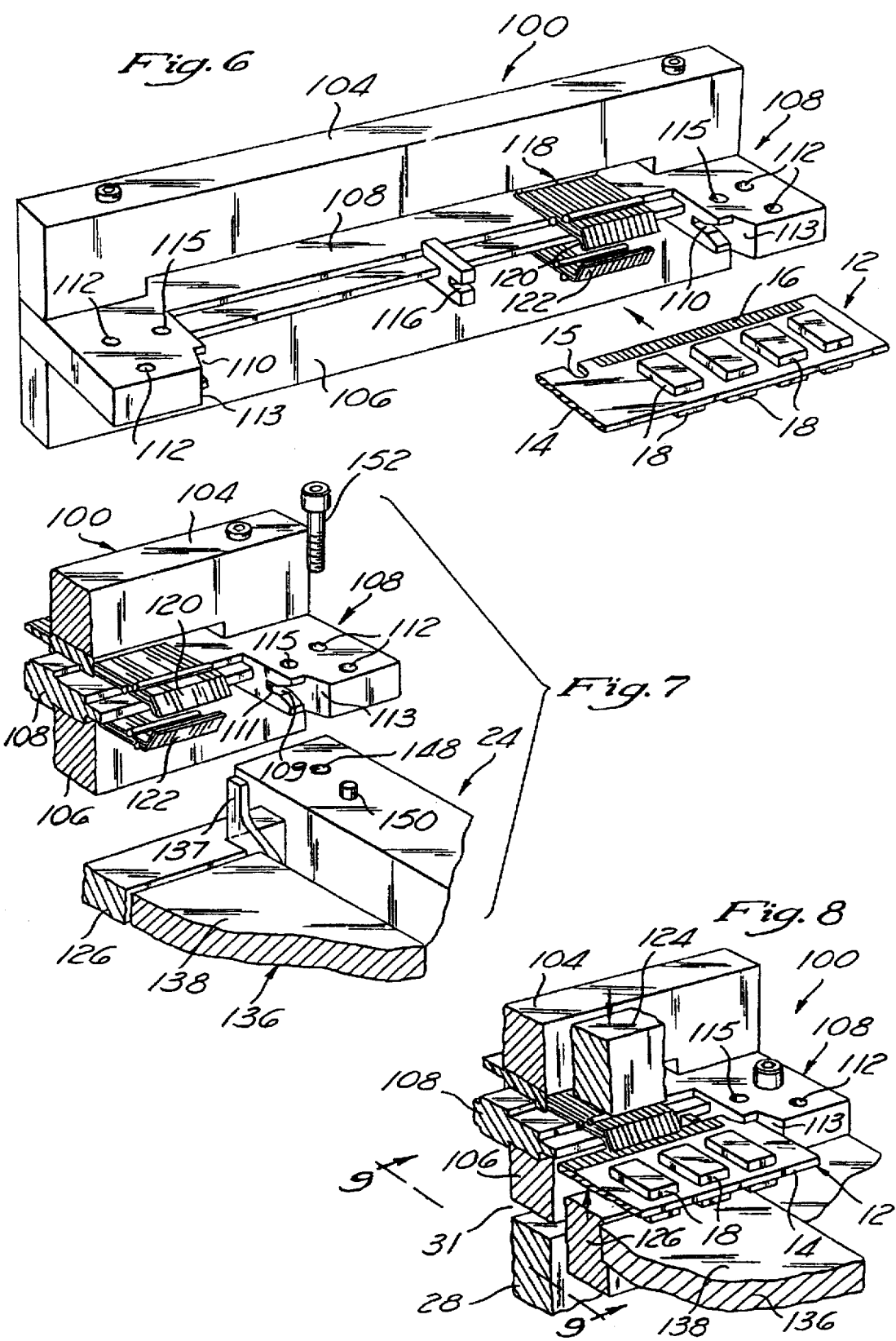

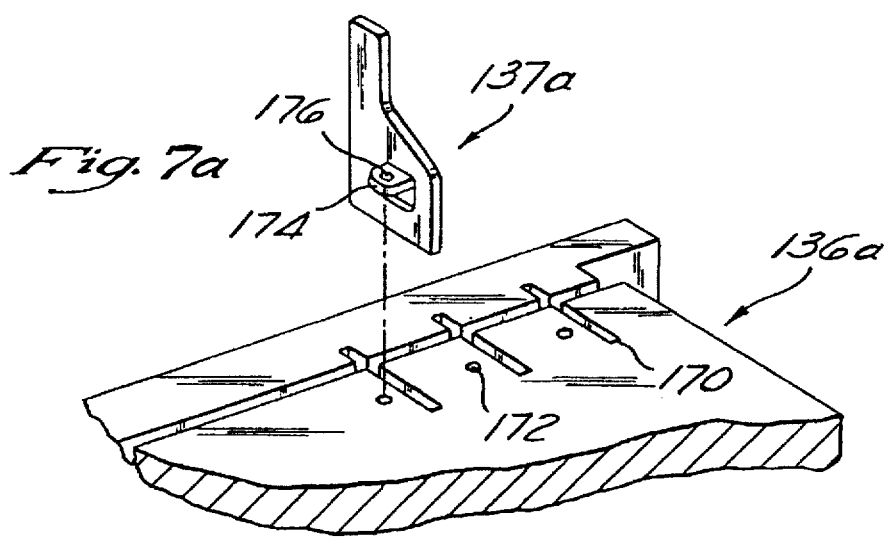
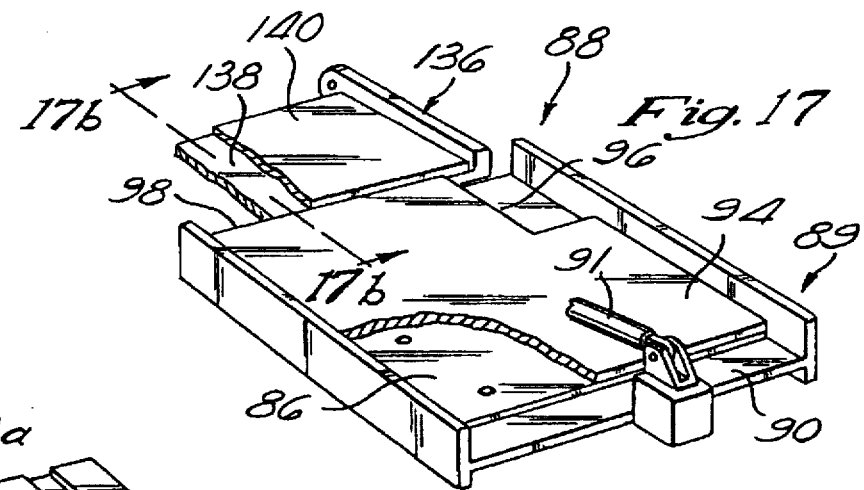
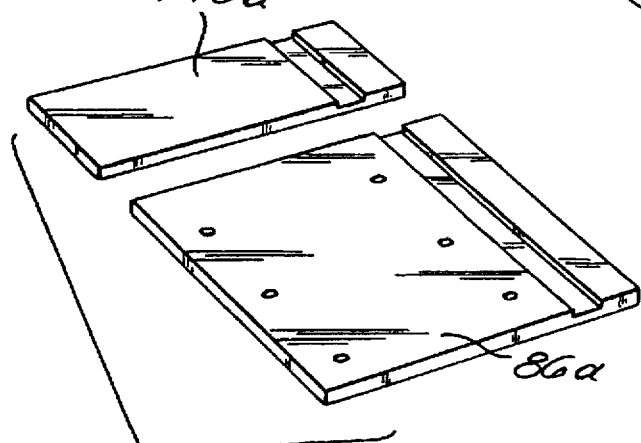
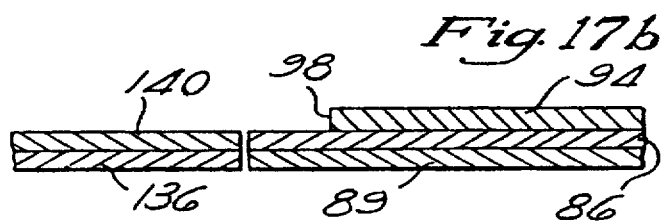

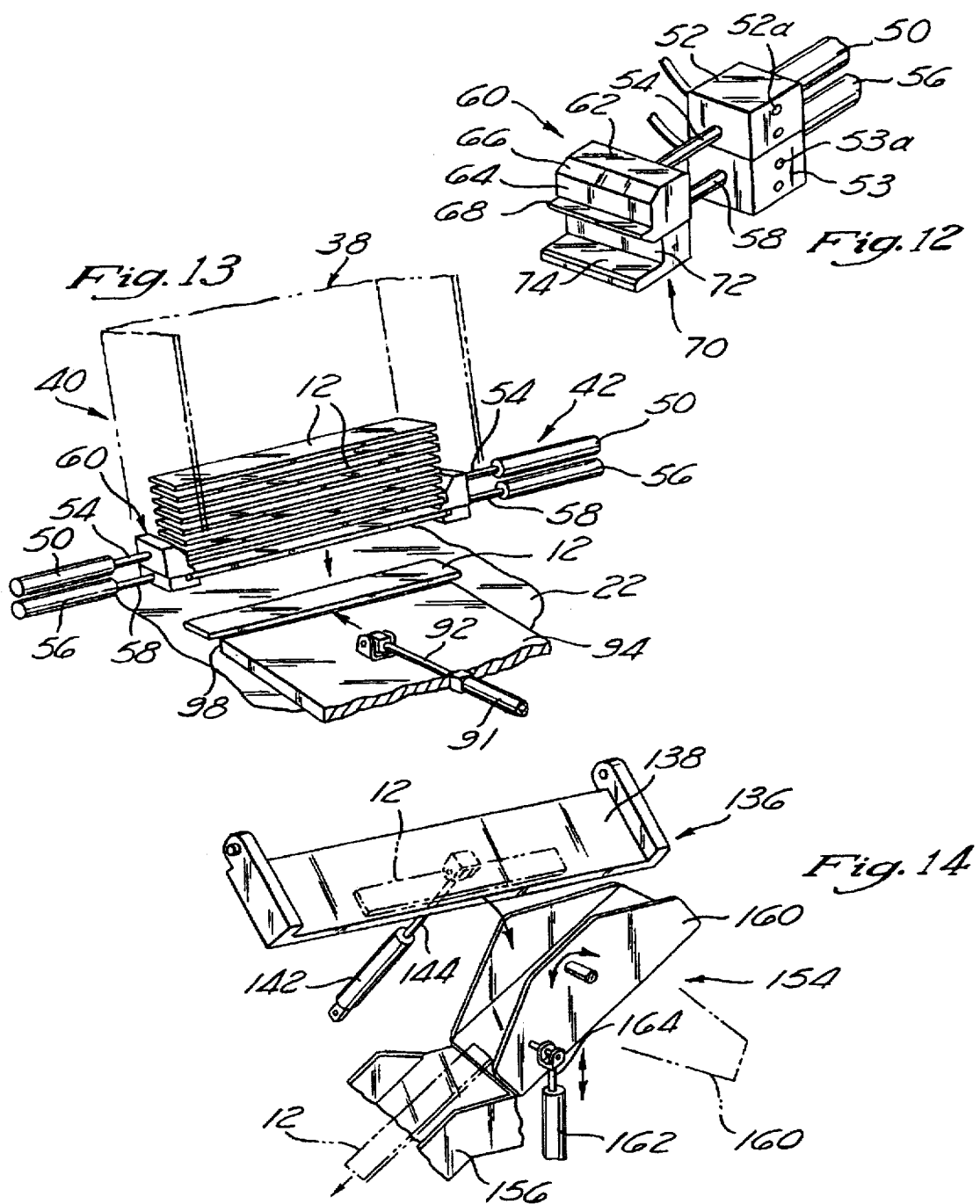

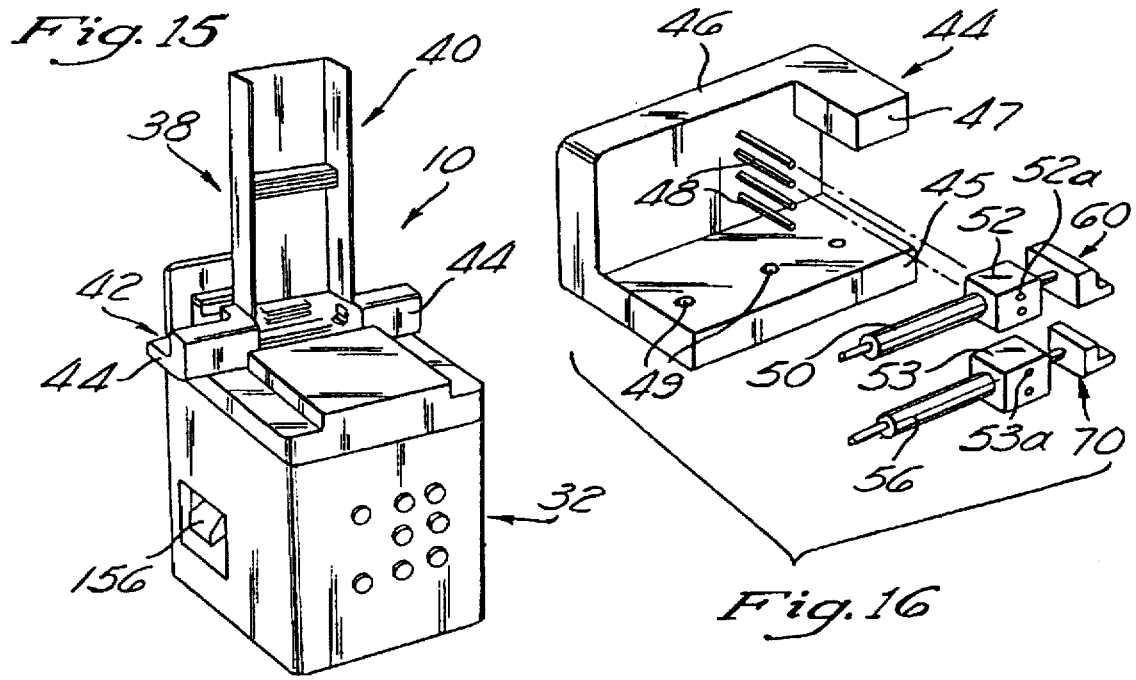
Fig. 15
Fig. 16
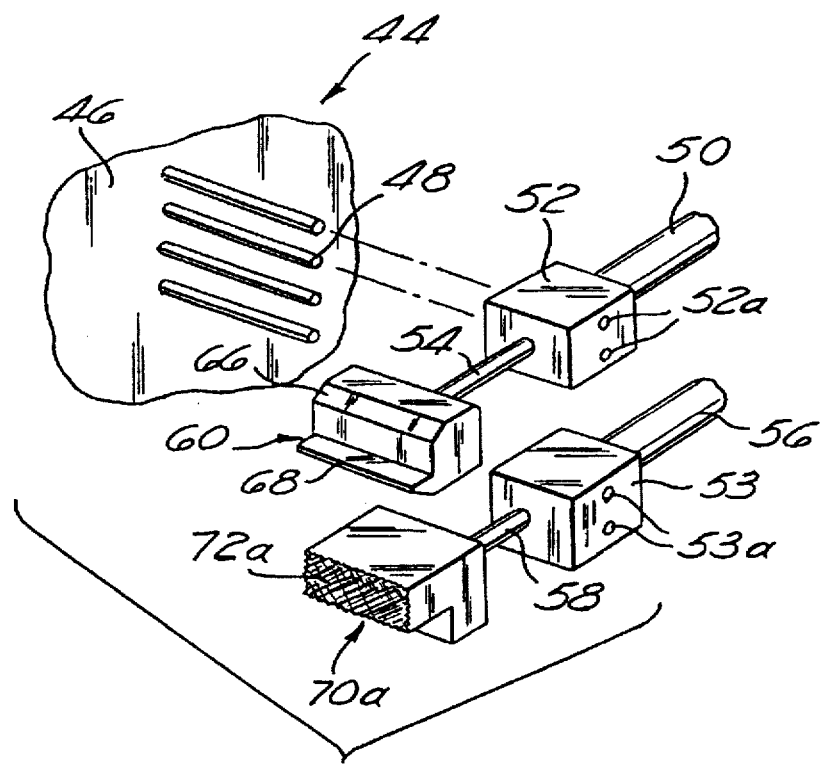
Fig. 12a

SIMM/DIMM BOARD HANDLER

FIELD OF THE INVENTION

The present invention relates generally to parts handling equipment, and more particularly to an improved electrical circuit board handling and testing apparatus. The apparatus constructed in accordance with the present invention is adapted to position each of an inventory of identical circuit boards into a test fixture and, subsequent to the completion of a testing protocol, sort each board in accordance with a test result. The present invention is particularly adapted for the handling and testing of small printed circuit boards which accommodate one or more memory devices, including circuit boards typically referred to as SIMM boards or SIMM's and DIMM boards or DIMM's.

BACKGROUND OF THE INVENTION

Handling devices to facilitate the testing of SIMM's and/or DIMM's are currently known in the prior art, and have been available for a number of years. Examples of such prior art handling/testing devices include the DM 718 Simm Handler manufactured by Computer Service Technology, Inc. of Dallas, Tex.; the "Model 838-MCM" by MC Systems, Inc. of Dallas, Tex.; and the "3000 B" handler/tester manufactured by Exatron of San Jose, Calif.

The prior art SIMM/DIMM handlers are substantially similar to each other with respect to their constructional details and operational methodology. As will be discussed in more detail below, though accomplishing the task of testing SIMM's and/or DIMM'S, such prior art handlers possess certain deficiencies which detract from their overall utility, such deficiencies being related to the cost, reliability, and accuracy thereof.

The SIMM/DIMM handlers constructed in accordance with the prior art (with the exception of the Exatron handler) typically include magazine trays of several sizes, each of which is adapted to accommodate a SIMM or DIMM circuit board of a corresponding width. In such handlers, the circuit boards are dropped from a respective magazine tray onto a conveyer which is driven by a stepper motor. A nub on the conveyor forces the dropped circuit boards through a guide platform, thereby positioning the boards on the conveyor in a lengthwise (i.e., longitudinal) orientation. After traveling longitudinally along the conveyor, the circuit boards abut a retractable, adjustable pneumatic stop which facilitates the proper positioning thereof under a test connector. To prevent any damage to the conveyor or the circuit boards, the motion of the conveyor must stop precisely when a circuit board contacts the pneumatic stop. As such, the timing between the abutment of a circuit board against the pneumatic stop and the discontinuation of the conveyor motion is critical.

The Exatron handler also requires the longitudinal movement of the circuit board which is gravity fed into a contactor region without the use of a conveyor. In this particular handler, the circuit boards are loaded thereinto in a manner wherein they are oriented with their longitudinal axes angled upwardly into a slotted tray. The slotted tray employs the use of stepper motor control to index a gravity fed track which feeds the circuit boards longitudinally into the contactor region where they are tested with custom contacts. Subsequent to being tested, the circuit boards are released from the contactor region and sorted into pass or fail directions via a gravity fed sorting flipper mechanism.

In addition to the importance of stopping the conveyor and/or board motion precisely when a circuit board abuts the pneumatic stop, the placement accuracy of each circuit board under the test connector in all the prior art handlers must be precisely adjusted to insure that the test fingers of the test connector are precisely aligned with the electrical connection pads on the circuit board. In the prior art handlers, when the circuit board reaches a proper position relative to the test connector, a sensor is triggered which facilitates the actuation of the test fingers into contact with the connector pads of the circuit board. When the test fingers have been placed into contact with the connector pads, a ready signal is sent to the test connector, thus initiating a desired testing protocol. Subsequent to the completion of such testing protocol, a "sort good" or a "sort bad" signal is generated, with the test fingers then being moved away from the circuit board and the conveyor being reactivated to facilitate the movement of the tested circuit board lengthwise into a sort section of the handler.

In the sort section of the prior art handlers, a sorting mechanism is provided for sorting the tested circuit boards into respective ones of a pair of bins, depending on whether a "sort good" or a "sort bad" signal has been generated by the test connector subsequent to the completion of the testing protocol. Typically, these bins are disposed on one side of the handler, and are either stacked or disposed in side-by-side relation to each other. In those prior art handlers wherein the bins are disposed in side-by-side relation to each other, the sorting mechanism typically includes a sort tray or sort arm which rotates about a vertical axis to direct each circuit board into the proper bin upon exiting the handler. In those prior art handlers wherein the bins are stacked, the sort tray or sort arm typically rotates about a horizontal axis and stops in alignment with one of a pair of exit chutes, each of which communicates with a respective one of the stacked bins. The exit chutes are often provided with sort verification sensors which are tripped by the circuit boards as they pass therethrough.

Perhaps the most significant deficiency of the prior art handlers is that the circuit boards travel lengthwise (i.e., longitudinally) therealong in only one direction and at only one height. As such, these handlers are exceedingly large, and must be sized having a width which is at least four times the length of the circuit board to properly accommodate the magazine, testing, sort, and chute sections of the handler. A further deficiency is that the prior art handlers are overly complex in construction, and necessitate the inclusion of numerous operating and coordinating elements. As such, these handlers require excessive manual set-up time, and are highly prone to misalignment during the testing operation, general failures, and high maintenance downtime.

Indeed, recent experience in high volume production of SIMM and DIMM circuit boards has indicated that these prior art part handlers (except for Exatron) experience frequent jamming, thereby requiring human intervention to resume normal operation. Such jams occur when two (2) circuit boards are dropped from the magazine tray instead of a single circuit board, and by warped boards failing to pass through the guide platform when contacted by the nub on the conveyor. In the prior art handlers, jamming is also often attributable to the lack of sufficient circuit board guidance or containment mechanisms, and the need to precisely recalibrate the guides for each new circuit board width of differing circuit boards which are tested in the handler. When jams occur, the operator is typically alerted thereto by the sound of the conveyor continuously trying to force movement of the circuit boards into a particular location within the handler. Jams also commonly occur in the sort section of the prior art handlers. The prior art handlers are typically not adapted to shut down when a jam occurs, thus often resulting in damage to the circuit boards.

As will be recognized, the jamming of the prior art handlers results in the added cost of damaged boards, as well as labor to clear the jams. Additionally, quality problems result from circuit boards damaged by jams, with the test fingers of the test connector also often being damaged by jammed circuit boards, thus requiring frequent replacement which is extremely costly and time consuming. Moreover, the jamming of these handlers often results in a "bottleneck" in the normal flow of work in the manufacturing plant.

Adding to the extreme complexity of the prior art handlers is their construction from a combination of electro-mechanical and pneumatic components, including stepper motors and conveyers in addition to pneumatic actuators. Such construction causes the handlers to be noisy, bulky, slow acting, large in size, and susceptible to frequent down time. In these prior art handlers, little provision is made for machine action alteration due to malfunction, with such handlers further being difficult to set-up and load for circuit boards of differing sizes. In this respect, such set-up normally requires several different magazine tray sizes and many small adjustments to the handler. With particular regard to the Exatron handler, the same is extremely expensive to manufacture due to its use of multiple stepper motors and the necessity of having to accurately control and coordinate the movements of many moving parts. The Exatron handler is also significantly larger in size than prior art conveyor style handler/testers, with the major disadvantages of the Exatron being that it is extremely oversized, overpriced, overly complex, and of limited capability.

A further deficiency with prior art handlers is their lack of reliability in sorting due to the proximity of the receiving bins thereto, the small angle and distance between the exit chutes, and an overall poor design of the sorting mechanism. The mechanical reliability of the prior art handlers is also relatively poor due to use of undersized fasteners therein. As previously indicated, such handlers are also extremely expensive to manufacture and operate due to their incorporation of complex mechanisms with expensive components, such as stepper motors, and the need for skilled calibration and fine tuning.

As previously indicated, perhaps the most significant deficiency of all prior art circuit board handlers is that the circuit boards travel lengthwise (i.e., along their longitudinal axes) therewithin. In this respect, lengthwise or longitudinal travel of over one full length of the circuit board is typically needed in such handlers for each separate handler function, including singulating, testing, sorting, and ejection. Thus, as also previously indicated, the prior art handlers are oversized, which results in shipping and handling problems, set-up problems attributable to the necessity of on-site assembly, the need for excessive floor space (which is often limited), and increased manufacturing costs.

The prior art handlers are also extremely difficult to operate since the operator must often make complex adjustments thereto. In this respect, during a normal day of operation, circuit boards of differing widths will typically be tested within the handler. Accordingly, the magazine tray of the handler must be changed out to match the circuit board width, with the longitudinal travel guide for the circuit board also being adjusted for each width. As previously indicated, the adjustment of the longitudinal travel guide must be precise, and if not exact, causes jamming of the circuit boards within the handler. Additionally, changes in the heights of the circuit boards tested within the handler requires the change-out of a board travel guide which must be precisely relocated in accordance with the circuit board widths.

As also previously indicated, the alignment between the connector pads of the circuit board and the testing fingers of the test connector must be precise. In this respect, the longitudinal movement of the circuit boards in the prior art handlers require such alignment to be provided by a retractable stop and/or sensor. Since the stop is typically a moving part, frequent tuning and readjustment is required between the testing fingers of the test connector and the connector pads of the circuit board. Moreover, the initial installation time and level of training associated with the prior art handlers are extremely high due to their complexity and design. Such complexity limits sales since a sales person must typically accompany the handler for demonstration before any purchase thereof is ultimately made by a buyer.

The longitudinal movement of the circuit boards in the prior art handlers also results in high operating costs due to damage which frequently occurs to the testing fingers of the test connector. In this respect, the testing fingers of the test connector often need replacement due to occurrences of damage thereto. Since in most prior art handlers the circuit board must travel longitudinally a distance of at least four (4) inches in very close proximity to the testing fingers while never contacting them, boards warped even less than 0.050 inches relative to their longitudinal axes are likely to contact the testing fingers, thus resulting in damage thereto. In the prior art handlers, a guide cannot be interfaced to the horizontally oriented surfaces of the circuit board near the connector pads while the circuit boards are traveling under the testing fingers, thus increasing the likelihood that the circuit boards will contact the testing fingers during their travel.

When a circuit board contacts the testing fingers due to the same being warped or due to an improper adjustment in the handler, the testing fingers are bent thereby and thus destroyed. Additionally, the longitudinal movement of the circuit boards in the prior art handlers inherently results in a lack of guidance for the vertical surfaces oriented between the connector pads. In this respect, this vertical edge of the circuit board cannot be guided since it must pass through the testing fingers of the test connector. Such lack of guidance often results in the circuit board contacting and damaging the testing fingers. The high operating costs of the prior art handlers are also attributable to other factors, including circuit boards being damaged due to the stepper motors and conveyors thereof forcing movement during jams. Additionally, such handlers require a dedicated operator and, as previously indicated, require a high level of maintenance.

The prior art handlers are also susceptible to output errors, and often sort in a wrong direction due to the proximity of the circuit board receiving bins thereto. In this respect, since the direction of circuit board travel is lengthwise or longitudinal, receiving bins for collecting good and bad circuit boards are typically located on a common side of the handler in side-by-side or stacked relation to each other. Thus, due to the close proximity of the receiving bins to each other, the continued movement of the conveyor subsequent to the jamming of a circuit board at the sort section often results in the circuit board "jumping" into the wrong receiving bin. The prior art handlers also have limited capabilities, in that the number of circuit board styles which can be tested therein is extremely limited. Additionally, customization for protruding components of the circuit boards or the irregular placement of memory chips is usually not feasible, with there being no insulating spacer under the circuit boards which can be customized. As will be discussed below, the present invention overcomes these and other deficiencies associated with prior art handlers.

SUMMARY OF THE INVENTION

In accordance with the present invention, there is provided a circuit board handling and testing apparatus (i.e., a circuit board handler) which comprises a housing defining a stationary top surface. Attached to the housing is a magazine assembly which is adapted to accommodate a plurality of circuit boards, and dispense the circuit boards onto the upper surface of the pivoting shelf member of a testing assembly attached to the housing one at a time. Each of the circuit boards stored within the magazine assembly defines a longitudinal axis. The testing assembly includes a modular testing component for receiving the circuit board dispensed onto the shelf member and performing a testing protocol thereon. The modular testing component is selectively removable from the testing assembly and replaceable with an alternative modular testing component. In this respect, one modular testing component of the circuit board handler is adapted to accommodate DIMM circuit boards, with an alternative modular testing component being adapted to accommodate SIMM circuit boards.

A reciprocal transport assembly attached to the housing pushes the circuit board dispensed onto the upper surface of the shelf member laterally relative to its longitudinal axis into the modular testing component of the testing assembly. A sorting assembly which is also attached to the housing selectively directs the tested circuit board into a particular containment vessel based upon the outcome of the testing protocol performed thereon. The testing assembly is adapted to eject the circuit board into the sorting assembly subsequent to the completion of the testing protocol.

In the preferred embodiment of the present invention, the magazine assembly of the circuit board handler comprises a singulator mechanism which is attached to the top surface of the housing. Releasably attached to the singulator mechanism is an elongate sleeve which is sized and configured to receive the circuit boards in stacked relation to each other. The singulator mechanism is adapted to dispense the circuit boards stored within the sleeve onto the shelf member of the testing assembly one at a time.

The singulator mechanism of the magazine assembly includes a pair of singulator support blocks which are releasably attached to the top surface of the housing in opposed relation to each other. The singulator support blocks may be adjusted inwardly or outwardly relative to each other for accommodating circuit boards of differing longitudinal lengths. The singulator support blocks are adapted to releasably receive the sleeve such that the sleeve extends upwardly from the top surface in generally perpendicular relation thereto. The singulator support blocks may alternatively be configured in a manner such that the sleeve is disposed at an angle of approximately ten degrees relative to an axis extending perpendicularly from the top surface when inserted into the singulator support blocks.

The singulator mechanism of the magazine assembly further comprises a top pair of cylinders which are attached to respective ones of the singulator support blocks in opposed relation to each other. The top pair of cylinders include a top pair of reciprocal piston rods extending therefrom in coaxial alignment with each other. Attached to respective ones of the top pair of piston rods is a top pair of blocks. In the preferred embodiment, the top pair of blocks each define a top surface and a generally planar, vertically oriented front surface having top and bottom edges. Extending angularly between the top surface and the top edge of the front surface is a sloped transitional surface, while extending along the bottom edge of the front surface is a retaining lip.

In addition to the top pair of cylinders, the singulator mechanism includes a bottom pair of cylinders which are attached to respective ones of the singulator support blocks in opposed relation to each other and in longitudinal alignment with respective ones of the top pair of cylinders. The bottom pair of cylinders include a bottom pair of piston rods extending therefrom in coaxial alignment with each other. Attached to respective ones of the bottom pair of piston rods is a bottom pair of blocks. In the preferred embodiment, the bottom pair of blocks each define a generally planar, vertically oriented front surface having top and bottom edges, with a retaining flange extending along the bottom edge of the front surface. The top and bottom pairs of the cylinders of the singulator mechanism each preferably comprise pneumatic cylinders.

The transport assembly of the circuit board handler preferably comprises a pusher cylinder which is attached to the top surface of the housing and has a reciprocal piston rod extending therefrom. Attached to the distal end of the piston rod is a pusher plate which defines a bumping edge for contacting the circuit board dispensed onto the upper surface of the shelf member. Like the top and bottom pairs of cylinders of the singulator mechanism, the pusher cylinder of the transport assembly preferably comprises a pneumatic cylinder.

The shelf member of the testing assembly of the circuit board handler is pivotally connected to the housing, with the generally planar upper surface thereof being positioned between the singulator support blocks. The shelf member is movable between a first position whereat the upper surface extends in generally co-planar relation to the top surface of the housing, and a second position whereat the upper surface slopes downwardly away from the top surface. The testing assembly further comprises upper and lower actuation bar cylinders which are each attached to the housing and include a reciprocal piston rod extending therefrom. In addition to the upper and lower actuation bar cylinders, the testing assembly includes a shelf cylinder which is attached to the housing and has a reciprocal piston rod extending therefrom. The piston rod of the shelf cylinder is itself attached to the shelf member.

The modular testing component of the testing assembly comprises upper and lower frame members having a guide member disposed therebetween. The guide member includes a pair of longitudinal locator slots which are sized and configured to receive the circuit board forced into the modular testing component by the transport assembly. Disposed between the longitudinal locator slots is a lower locator member for, among other things, limiting the distance the circuit board is pushed into the modular testing component by the transport assembly.

The modular testing component also includes a test connector which is disposed between the guide member and the upper and lower frame members. The test connector itself includes an upper cantilevered set of flexible, resilient testing fingers which extend from between the guide member and the upper frame member. In addition to the upper set of testing fingers, the test connector includes a lower cantilevered set of flexible, resilient testing fingers which extend from between the guide member and the lower frame member.

The testing assembly further comprises an upper actuation bar which is pivotally connected to the housing. The upper actuation bar is movable between a loading position whereat the upper actuation bar extends laterally across the upper set of testing fingers, and a testing position whereat the upper actuation bar flexes the upper set of testing fingers downwardly toward the top surface of the housing. The piston rod of the upper actuation bar cylinder is selectively engageable to the upper actuation bar. In addition to the upper actuation bar, the testing assembly includes a lower actuation bar which is also pivotally connected to the housing. The lower actuation bar is itself movable between a loading position whereat the lower actuation bar extends laterally across the lower set of testing fingers, and a testing position whereat the lower actuation bar flexes the lower set of testing fingers upwardly away from the top surface of the housing. The piston rod of the lower actuation bar cylinder is selectively engageable to the lower actuation bar.

The upper actuation bar, lower actuation bar and shelf cylinders each preferably comprise a pneumatic cylinder. Additionally, the upper surface of the shelf member includes a sheet of low-friction, anti-static material which is preferably fabricated from polyethylene applied thereto. The shelf member also preferably includes an ejector tab which extends therefrom and is adapted to aid in the ejection of the circuit board from within the testing assembly during the movement of the shelf member from its first position to its second position. The shelf member also has various slots which receive one or more ejector tabs or plates which can be moved from slot to slot by the operator to accommodate various board lengths.

The modular testing component of the testing assembly may alternatively comprise upper and lower frame members having a guide member disposed therebetween. The guide member includes a pair of longitudinal locator slots which are sized and configured to receive the circuit board forced into the modular testing component by the transport assembly. Disposed between the longitudinal locator slots is a lower locator member which defines a stopping surface for limiting the distance the circuit board is pushed into the modular testing component of the transport assembly. The alternative modular testing component further comprises a test connector which is disposed between the guide member and the upper frame member. The test connector includes a cantilevered set of flexible, resilient testing fingers which extend from between the guide member and the upper frame member. When the alternative modular testing component is attached to the housing, the upper actuation bar of the testing assembly is movable between a loading position whereat the upper actuation bar extends laterally across the testing fingers, and a testing position whereat the upper actuation bar flexes the testing fingers downwardly toward the top surface of the housing.

The sorting assembly of the circuit board handler constructed in accordance with the present invention itself preferably comprises a pair of exit chutes which are attached to and extend from the housing. In addition to the exit chutes, the sorting assembly includes a tilt tray which is pivotally connected to the housing and is movable between first and second positions whereat the tilt tray is aligned with respective ones of the exit chutes. Attached to the housing is a tilt cylinder having a reciprocal piston rod extending therefrom which is pivotally connected to the tilt tray. The tilt cylinder also preferably comprises a pneumatic cylinder.

Further in accordance with the present invention, there is provided a method for handling and testing circuit boards. The preferred method comprises the steps of providing a housing which defines a stationary top surface, and dispensing the circuit boards onto the pivoting shelf member of a testing assembly one at a time. Thereafter, the circuit board dispensed onto the upper surface of the shelf member is pushed laterally relative to its longitudinal axis into a modular testing component of the testing assembly which is also attached to the housing. A testing protocol is then performed on the circuit board inserted into the modular testing component of the testing assembly, with the circuit board being ejected from the testing assembly subsequent to the completion of the testing protocol and directed into a particular containment vessel based upon the outcome of the testing protocol. The modular testing component may be removed from the testing assembly, with an alternative modular testing component being substituted therefore.

The step of dispensing the circuit boards onto the upper surface of the shelf member preferably comprises the initial step of providing a magazine assembly which includes a singulator mechanism attached to the housing and having an opposed, reciprocally movable top pair of blocks and an opposed, reciprocally movable bottom pair of blocks disposed in longitudinal alignment with respective ones of the top pair of blocks. The magazine assembly also includes a sleeve which is reasonably attached to the singulator mechanism. A plurality of circuit boards are stacked into the sleeve such that the lowermost or bottom circuit board contacts the bottom pair of blocks. The top pair of blocks are then actuated toward each other so as to isolate a single circuit board between the top and bottom pairs of blocks. Thereafter, the bottom pair of blocks are actuated away from each other so as to dispense the isolated single circuit board onto the upper surface of the shelf member, with the bottom pair of blocks then being actuated back toward each other. The top pair of blocks are then actuated away from each other so as to cause the stacked circuit boards to drop into contact with the bottom pair of blocks.

The step of performing the testing protocol of the circuit board inserted into the testing assembly comprises the initial step of providing the modular testing component of the testing assembly with upper and lower cantilevered sets of flexible, resilient testing fingers. The upper and lower sets of testing fingers are flexed into contact with the circuit board inserted into the modular testing component of the testing assembly, with the upper and lower sets of testing fingers subsequently being allowed to resiliently return to their unflexed orientation upon the completion of the testing protocol.

The step of performing the testing protocol on the circuit board may alternatively comprise the initial step of providing the modular testing component of the testing assembly with one cantilevered set of flexible, resilient testing fingers. The testing fingers are flexed into contact with the circuit board installed into the modular testing component of the testing assembly, with the testing fingers subsequently being allowed to resiliently return to their unflexed orientation upon the completion of the testing protocol.

The step of ejecting the circuit board from the testing assembly subsequent to the completion of the testing protocol itself preferably comprises the initial step of pivotally connecting the shelf member of the testing assembly to the housing such that the shelf member is pivotally movable between a first position whereat the upper surface extends in generally parallel relation to the top surface of the housing and a second position whereat the upper surface slopes downwardly away from the top surface. The shelf member is actuated from its first position to its second position subsequent to the completion of the testing protocol on the circuit board within the modular testing component of the testing assembly. After being moved to its second position, the shelf member is actuated back to its first position.

The step of directing the ejected circuit board into a particular containment vessel based upon the outcome of the testing protocol itself preferably comprises the initial step of providing a sorting assembly which is attached to the housing and includes a pair of exit chutes extending from the housing and a tilt tray which is pivotally movable between first and second positions whereat the tilt tray is aligned with respective ones of the exit chutes. The tilt tray is actuated to one of its first and second positions depending upon the outcome of the testing protocol, thus facilitating the placement of the tested circuit board into the appropriate containment vessel. Between cycles of the circuit board handler of the present invention and when the same is deactivated, the tilt tray always defaults to a position in alignment with that exit chute which is directed toward the containment vessel accommodating failed circuit boards so as to ensure that if a malfunction of the handler occurs, the circuit boards will sort to the fail direction.

As is evident from the foregoing, the circuit board handler constructed in accordance with the present invention is adapted to automatically direct DIMM or SIMM memory boards or various other plug-in style circuit boards into a testing fixture, and then to sort the boards based upon the result of the test performed thereon. Through the automation of this process, the handler of the present invention decreases labor costs and increases the accuracy of failure discrimination. These attributes of the present invention are important factors in the highly competitive DIMM/SIMM market within which cost and quality provide competitive advantages to the manufacturer.

In the handler of the present invention, the magazine assembly will typically be manually loaded with the DIMM or SIMM circuit boards to be tested. The handler may be operated in either manual or automatic modes and, when in the automatic mode, continues to operate as long as circuit boards are present within the magazine assembly. As previously explained, the operation of the present handler proceeds in a sequence of distinct steps. Once a single circuit board is dropped from the magazine assembly onto the shelf member of the testing assembly, the same is pushed into the modular testing component of the testing assembly, with the testing fingers of the testing assembly being flexed into contact with the corresponding connection pads of the circuit board. After electrical connection is made between the testing fingers and their corresponding connection pads, the handler sends a signal to a tester electrically connected to the testing assembly to initiate the testing protocol.

Subsequent to the completion of the testing protocol, the tester sends a "pass" or "fail" signal to the handler based upon the test results. The testing fingers are then removed from contact with the connection pads of the circuit board, with the tested circuit board then being ejected out of the testing assembly into the sorting assembly. Once directed into the sorting assembly, the tested circuit board is sorted into a particular containment vessel or collection bin via a corresponding exit chute depending on whether a "pass" or "fail" signal has been generated by the tester. Rather than being placed into containment vessels, the tested circuit boards may also be dropped onto an automated transport system such as a conveyor for subsequent production operations. The operation of the handler of the present invention in the manual mode allows an operator to troubleshoot the system, with the aforementioned operational steps being the same for operation in both the automatic and manual modes.

The handler constructed in accordance with the present invention is preferably provided with one sensor located under the magazine assembly, and another sensor located on the exit end of each exit chute. The magazine assembly sensor includes an optical transmitter and receiver pair. As circuit boards fall through and below the optical beam of the magazine assembly sensor one at a time, the controller of the circuit board handler receives a signal that the circuit board has, in fact, moved from the magazine assembly to its appropriate position upon the top surface of the housing. If two circuit boards are dispensed from the magazine assembly instead of only one as intended or if a circuit board does not lay flat after being dropped, the total height of the two circuit boards or non-flat board will interfere with the optical beam, thus causing the handler to stop and generate an alarm in the form of either an audible signal or the activation of a failure light.

The sensors located on the exit ends of the exit chutes are adapted to verify that the circuit boards have been dropped in the proper direction. In this respect, if the chute sensors are not triggered according to the sort signal received from the tester, the handler will automatically stop operation, with a programmed error action again being initiated by the controller. Because the handler constructed in accordance with the present invention includes no conveyor belt, stepper motors, or complex sorting machinery and does not require critical manual adjustments, it is simple in construction and extremely reliable in operation. Additionally, the present handler is primarily adapted to handle and test either DIMM or SIMM circuit boards, depending on the configuration of the modular testing component included with the testing assembly. However, the present handler is also capable of testing other "plug-in" style circuit boards.

The circuit board handler constructed in accordance with the present invention can be used in relation to any plug-in memory module. The most common memory modules with which the present invention is utilized are seventy two (72) pin SIMM modules, one hundred sixty eight (168) pin DIMM modules, thirty (30) pin SIMM modules, one hundred forty four (144) pin DIMM modules, and two hundred (200) pin DIMM modules. The change out time needed to go from one to another type of memory module is approximately five minutes.

In the handler of the present invention, the lateral insertion of the circuit boards into the modular testing component of the testing assembly substantially reduces the size of the handler and thus the floor space needed therefore. Such reduced size also simplifies shipping, and allows the handler to be received as an assembled unit, thus minimizing set-up time. Indeed, typical set-up time for the present handler is approximately 15 minutes, as opposed to days or even weeks as is usually necessary for prior art circuit board testers/handlers. Additionally, in the present handler, the circuit boards enter the testing assembly laterally, and are then backed out of the testing assembly by the downward pivotal movement of the shelf member thereof. Such movement presents significant advantages over the prior art handlers wherein the circuit board enters the testing assembly in a longitudinal direction, and then continues in the same longitudinal direction subsequent to the completion of the test, thus giving rise to the disadvantage of the inability to use fixed, precise locating methods.

As previously indicated, unlike the present handler, those constructed in accordance with the prior art are dependent upon locating mechanisms which include retracting stops and/or sensors, the use of which significantly increases occurrences of malfunction. Moreover, due to the manner in which the circuit boards are inserted into and ejected from within the testing assembly of the present handler, the travel paths of the circuit board overlap, thus allowing for a substantial reduction in the overall size of the handler. In the prior art handlers wherein the circuit boards move longitudinally, the travel paths of the circuit boards do not overlap, thus causing the prior art handlers to be significantly greater in size than the present handler.

The handler constructed in accordance with the present invention is also extremely easy to operate, with the operator rarely having to make adjustments thereto. In this respect, the magazine assembly is adapted to accommodate circuit boards of all widths. Additionally, since the movement of the circuit board into the testing assembly is lateral and the transport assembly pushes the circuit board until stopped by the circuit board acting against the lower locator member, there is no adjustment needed for board width other than for the guide rails of the magazine assembly which are easily adjusted and are not even necessary if the sleeve of the magazine assembly is tilted or angled.

The ease of use of the present handler is also attributable to the guiding surfaces for the circuit boards being fixed since they act on the length of the circuit board which is fixed. Indeed, all precision guide requirements locate on precision pins or slots with permanent, factory set positions, and thus need not be calibrated by the operator. Further, circuit boards of differing heights are accommodated in the present handler by changing out particular components of the handler as opposed to making adjustments. In the present handler, the longitudinal alignment between the testing fingers and the connector pads of the circuit boards, which is perhaps the most critical positioning requirement during testing, is factory set and never changes. Indeed, no moving parts are involved in this positioning, with the lateral movement of the circuit boards allowing the same to be inserted into the longitudinal locator slots which facilitate the longitudinal alignment of the testing fingers with the connector pads. As previously indicated, the handler of the present invention comes assembled, with the initial set-up time being only approximately 15 minutes. The handler is also adapted to be low maintenance, with no lubrication being required due to material choices and no elastic components such as conveyor belts being included therein which tend to loosen or otherwise degrade over time.

In addition to being easy to operate, the handler of the present invention also provides the advantages of low operating cost. As previously indicated, high operating costs of the prior art handlers are greatly attributable to damage occurring to the testing fingers. In the present handler, the lateral insertion of the circuit board into the testing assembly allows the circuit board to be entirely contained within guides before and during travel under the testing fingers, with there being only approximately 1/10th of an inch of lateral movement of the circuit board under the testing fingers. Accordingly, the risk of testing finger damage attributable to the boards inadvertently contacting the same is virtually eliminated in the present handler, with damage to the circuit boards themselves rarely occurring due to all movement being facilitated via flow controlled, pneumatic cylinders, with low pressure and thus low force creating gentle action on the circuit boards. The lateral movement of the circuit boards also allows pneumatic cylinders to be employed in the present handler, each of which are rated at one million plus cycles, thus eliminating maintenance requirements.

The present handler also provides output reliability which is unmatched by prior art handlers. In this respect, since the present handler sorts good and bad circuit boards on opposite sides thereof and the tilt tray always defaults to a failed position, it is virtually impossible to missort such that a failed circuit board is placed into the containment vessel accommodating those circuit boards which have passed the testing protocol. As previously indicated, such improper sorting often occurs with those prior art handlers incorporating conveyors.

As previously explained, the manufacturing costs of the present handler are minimized due to the relatively small size thereof attributable to the lateral movement of the circuit boards into the testing assembly and the relatively short distances the circuit boards must travel. Accordingly, a conveyor is not required in the present handler, with an entirely pneumatic system being possible, thus significantly lowering the manufacturing, engineering and operating costs thereof. Additionally, the cycle time of the present handler is extremely quick attributable to the short travel distances associated with the lateral insertion of the circuit boards into the testing assembly. Such rapid cycle times are also attributable to the previously described overlapping travel paths in the present handler.

In addition to the foregoing, the lateral movement of the circuit boards into the modular testing component of the testing assembly allows circuit boards of unusual shapes to be tested in the present handler. In this respect, circuit boards which do not lay flat due to an odd placement of a memory chip or due to a protruding component beyond the chips can be tested by inserting specialized spacers within the handler which include grooves or channels for accommodating a protruding chip, or which include supports for missing chips. Since the boards are inserted laterally into the testing assembly, there is a wide surface over which the circuit boards pass during insertion. Accordingly, material can be removed to accommodate a protruding component, without adversely affecting the support of the circuit board. As also previously indicated, due to the circuit boards reversing direction when ejected from within the testing assembly, the need for retracting stops and/or sensors is eliminated in the present handler.

BRIEF DESCRIPTION OF THE DRAWINGS

These, as well as other features of the present invention, will become more apparent upon reference to the drawings wherein:

FIG. 1 is a top perspective view of a DIMM circuit board;

FIG. 2 is a front perspective view of the circuit board handler/testing apparatus constructed in accordance with the present invention;

FIG. 3 is a front, partial perspective view of the testing, transport and sorting assemblies of the handler/testing apparatus;

FIG. 6 is a front, perspective view of a modular testing component of the testing assembly, illustrating the manner in which a circuit board in inserted thereinto;

FIG. 7 is an exploded, partial perspective view of the testing assembly, illustrating the manner in which the modular testing component is interfaced to the handler/testing apparatus;

FIG. 7a is a partial perspective view of an alternative embodiment of the shelf member of the testing assembly of the handler/testing apparatus;

FIG. 8 is a front, partial perspective view of the testing assembly, illustrating the manner in which the modular testing component is actuated into engagement with a circuit board disposed therein;

FIG. 12 is a partial perspective view of the singulator mechanism of the magazine assembly of the handler/testing apparatus;

FIG. 12a is an exploded, partial perspective view of an alternative embodiment of the singulator mechanism of the magazine assembly of the handler/testing apparatus;

FIG. 13 is a partial perspective view illustrating the manner in which the singulator mechanism of the magazine assembly facilitates the placement of a single circuit board into alignment with the transport assembly;

FIG. 14 is a partial perspective view illustrating the manner in which the testing assembly cooperates with the sorting assembly subsequent to the completion of the testing protocol on a circuit board;

FIG. 15 is a front perspective view of the circuit board handler/testing apparatus of the present invention, illustrating the magazine assembly thereof in an alternative orientation;

FIG. 16 is an exploded, partial perspective view of the singulator mechanism of the magazine assembly of the handler/testing apparatus;

FIG. 17 is a partial perspective view of an alternative embodiment of the transport assembly of the handler/testing apparatus;

FIG. 17a is a perspective view of alternative spacer sheets which may be incorporated into the testing assembly shown in FIG. 17; and FIG. 17b is a cross-sectional view taken along line 17b—17b of FIG. 17.

DETAILED DESCRIPTION OF THE PREFERRED EMBODIMENT

Figure 4:
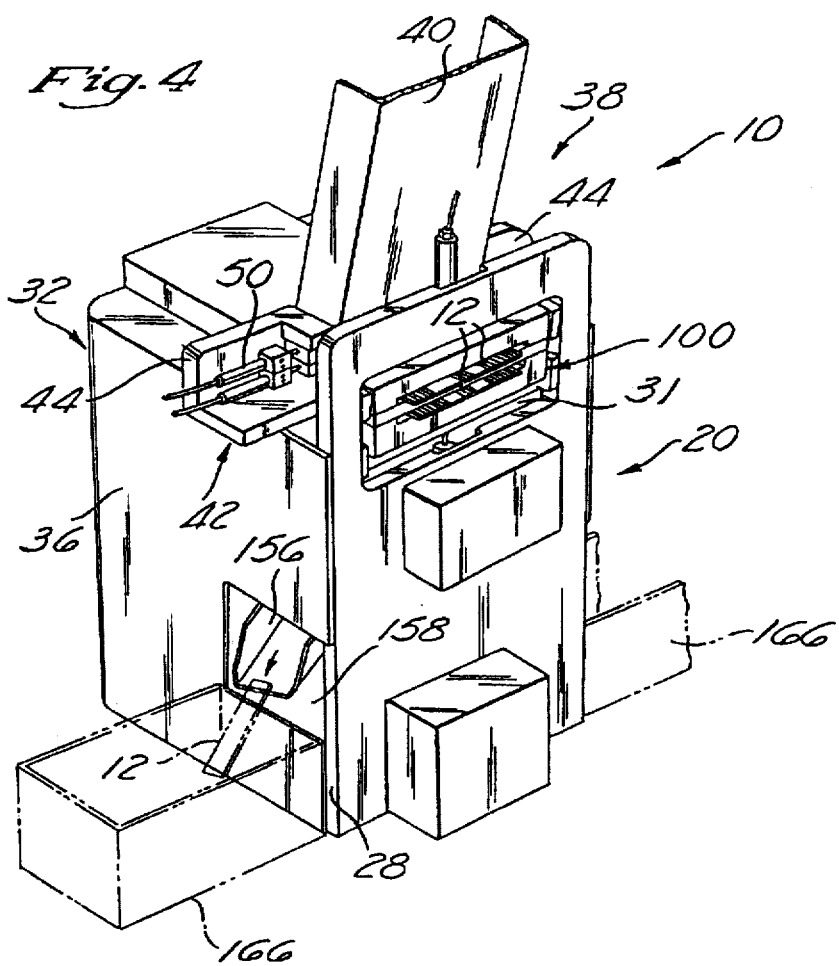
FIG. 4 is a rear, perspective view of the handler/testing apparatus shown in FIG. 2.

Referring now to the drawings wherein the showings are for purposes of illustrating a preferred embodiment of the present invention only, and not for purposes of limiting the same, FIGS. 2 and 4 perspectively illustrate the circuit board handling/testing apparatus (i.e., handler) 10 constructed in accordance with the present invention. Referring now to FIG. 1, the handler 10 is particularly adapted to perform a desired testing protocol on a dual in-line memory module or "DIMM" circuit board 12. The circuit board 12 typically comprises an elongate, rectangularly configured base board 14 which defines a longitudinal axis A. Disposed on the top surface of the base board 14 and extending along one of the longitudinal edges thereof are a plurality of connector pads 16 which are arranged in two (2) linearly aligned rows separated by a notch 15. Additionally, disposed on the bottom surface of the base board 14 are a plurality of connector pads 17 which extend along the same longitudinal edge as the connector pads 16, and are also arranged in two (2) linearly aligned rows separated by the notch 15. Secured to the top and optionally to the bottom surface of the base board 14 in spaced relation to each other are a plurality of memory chips 18. In typical DIMM circuit board construction, the length of the base board 14 is usually constant. However, the base boards 14 of DIMM circuit boards are frequently provided in differing widths, depending on the intended use for the circuit board 12.

Figure 5:
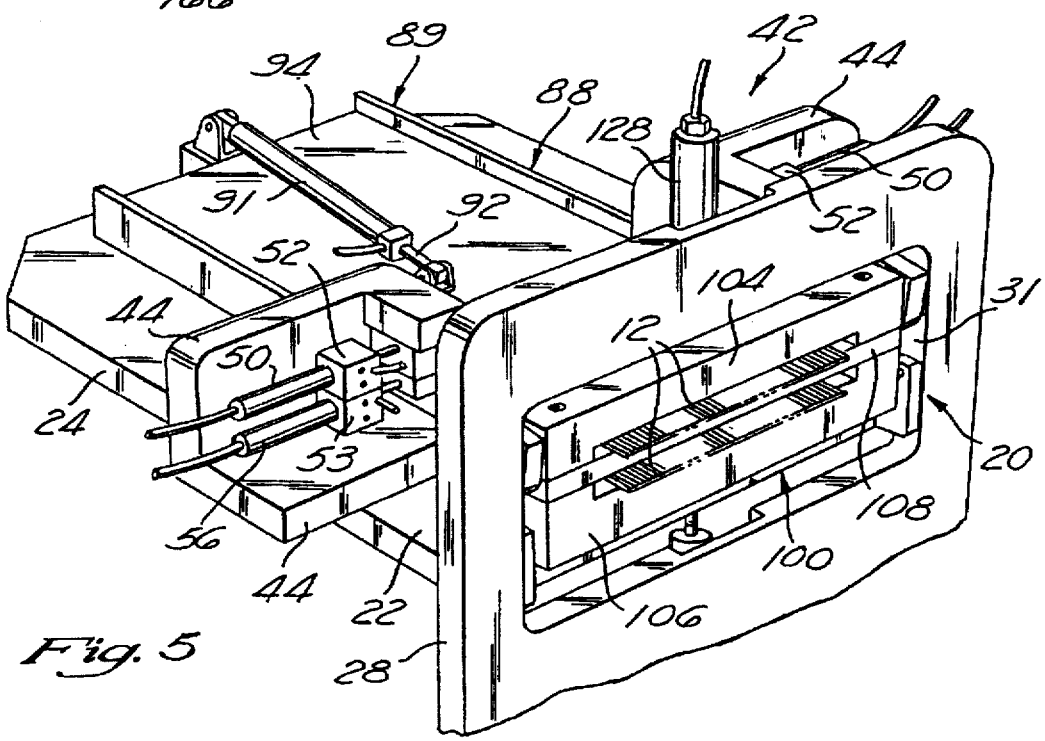
FIG. 5 is a rear, partial perspective view of the testing and transport assemblies of the handler/testing apparatus.

In the preferred embodiment, the handler 10 comprises an enclosure or housing 20 which, as best seen in FIGS. 2–5 and 11, defines a stationary, horizontally oriented top surface portion 22 having a generally planar (i.e., flat) configuration. The top surface 22 is defined by a top plate 24 of the housing 20. In addition to the top plate 24, the housing 20 includes a bottom plate 26 and a back plate 28. Extending perpendicularly between the top and bottom plates 24, 26 is a vertically oriented support bar 30, the use of which will be discussed in more detail below. As best seen in FIG. 5, a portion of the back plate 28 extends upwardly beyond the top surface 22 of the top plate 24 in generally perpendicular relation thereto. Disposed within this upwardly extending portion of the back plate 28 is a rectangularly configured opening 31. The support structure defined by the top, bottom and back plates 24, 26, 28 and support bar 30 has a cover member 32 applied thereto which defines the front wall 34 and the opposed sidewalls 36 of the housing 20.

In the preferred embodiment, the top, bottom and back plates 24, 26, 28 and support bar 30 are each fabricated from a metal material, and preferably aluminum. Additionally, these structural elements are preferably secured to each other through the use of fasteners such as screws, though alternative attachment methods may also be employed. The cover member 32 itself is preferably attached to the remainder of the housing 20 through the use of thumb screws, thus allowing the same to be easily removed for purposes of gaining access from the front and sides to the internal components of the handler 10 disposed within the housing 20. The cover member 32 also provides the handler 10 with an aesthetic appearance, and protects the operator from mechanical pinch points and the possibility of electrical shock. As seen in FIG. 2, the operational buttons for the handler 10 are preferably located on the front wall 34 defined by the cover member 32 for purposes of providing easy access thereto by the operator.

Disposed within the hollow interior of the housing 20 is a programmable controller which coordinates the operation of the various sub-assemblies of the handler 10, including a testing module which is also disposed within the housing 20. The structure and manner of operation of each of these sub-assemblies will now be described in more detail below.

1. Magazine Assembly

Referring now to FIGS. 2–5 and 13, the handler 10 of the present invention is provided with a magazine assembly 38 attached to the housing 20 for accommodating a plurality of circuit boards 12 and dispensing the same onto the top surface 22 of the housing 20 one at a time. In the preferred embodiment, the magazine assembly 38 comprises an elongate sleeve 40 which defines top and bottom ends, a back wall and opposed sidewalls. As seen in FIG. 2, the sleeve 40 is sized and configured to receive the circuit boards 12 in stacked relation to each other. In the handler 10, the circuit boards 12 are placed into the sleeve 40 such that the bottom surface of the base board 14 including the connector pads 17 disposed thereon is directed downwardly, with the top surface of the base board 14 having the connector pads 16 disposed thereon being directed upwardly. Additionally, the longitudinal edge of the base board 14 having the connector pads 16, 17 extending therealong is positioned against the back wall of the sleeve 40. As will be recognized, the distance separating the sidewalls of the sleeve 40 from each other is substantially equal to, but slightly exceeds, the longitudinal length of the base board 14 of each circuit board 12.

Referring now to FIGS. 2–5, attached to the top surface 22 of the housing 20 is a singulator mechanism 42 of the magazine assembly 38. In the handler 10, the sleeve 40 is releasably attached to the singulator mechanism 42 either prior or subsequent to the circuit boards 12 being stacked thereinto. The singulator mechanism 42 is adapted to dispense the circuit boards 12 stored within the sleeve 40 onto another sub-assembly of the handler 10 (which is attached to the housing 20) one at a time. The singulator mechanism 42 comprises a pair of singulator support blocks 44 which are attached to the top surface 22 in opposed relation to each other. The singulator support blocks 44 are sized and configured to releasably receive the sleeve 40, and in particular the bottom end thereof. When the sleeve 40 is inserted into the singulator support blocks 44, the sleeve 40 extends upwardly from the top surface 22 of the housing 20.

As best seen in FIG. 16, each of the singulator support blocks 44 includes a horizontal wall portion 45 and a vertical wall portion 46 which extends upwardly from one edge of the horizontal wall portion 45 at an angle of approximately 90 degrees. Extending laterally from an upper corner region of the vertical wall portion 46 is an ear portion 47 which extends in spaced, generally parallel relation to the horizontal wall portion 45. Additionally, extending laterally from the vertical wall portion 46 are four (4) vertically oriented, linearly aligned elongate pins 48, the use of which will be described in more detail below.

In the preferred embodiment, each of the singulator support blocks 44 is releasably attached to the top surface 22 of the housing 20. Such releasable attachment is facilitated by the extension of a fastener such as a screw through one of the three (3) longitudinally aligned apertures 49 disposed within the horizontal wall portion 45 of each singulator support block 44. As will also be discussed in more detail below, the inclusion of three (3) apertures 49 within each singulator support block 44 allows the blocks 44 to be adjusted inwardly and outwardly relative to each other for accommodating circuit boards 12 of differing longitudinal lengths.

In the preferred embodiment, the singulator support blocks 44 are formed in a manner such that the sleeve 40, when releasably attached to the singulator mechanism 42, extends in generally perpendicular relation (i.e., at an angle of approximately 90 degrees) relative to the top surface 22 of the housing 20. The singulator support blocks 44 may alternatively be formed in a manner such that the sleeve 40, when releasably attached to the singulator mechanism 42, slopes at an angle of approximately 10 degrees relative to an axis extending perpendicularly from the top surface 22. By maintaining the sleeve 40 at this angle relative to the top surface 22, the stacked circuit boards 12 within the sleeve 40 are less susceptible to falling out of the magazine assembly 38.

Importantly, the singulator support blocks 44 are attached to the top surface 22 such that the distance separating the inner surfaces thereof which are directed toward each other is substantially equal to, and only slightly exceeds, the longitudinal length of the base boards 14 of the circuit boards 12. In this respect, the preferred distance separating a longitudinal end of the base board 14 and a respective singulator support block 44 is approximately 0.040 inches. However, as previously indicated, circuit boards 12 of differing longitudinal lengths may be accommodated in the handler 10 by adjusting one or both of the singulator support blocks 44 inwardly or outwardly relative to the other singulator support block(s).

Those of ordinary skill in the art will recognize that if the singulator support block(s) are adjusted inwardly or outwardly relative to each other, the width of the sleeve 40 of the magazine assembly 38 must likewise be adjusted to a width which corresponds to the distance separating the singulator support blocks 44 from each other. Such adjustment can be facilitated by changing out the sleeve 40 to one having a different size, or providing the sleeve 40 with opposed sidewalls which are adjustable inwardly and outwardly relative to each other.

Though the sleeve 40 may be oriented at an angle of approximately 10 degrees relative to the perpendicular axis of the top surface 22 of the housing 20, those of ordinary skill in the art will recognize that the sleeve 40 may also be oriented at a slightly steeper angle relative to the perpendicular axis of the top surface 22 (e.g., approximately 15 degrees) to insure that the circuit boards 12 stacked within the sleeve 40 do not fall from the magazine assembly 38 during the operation of the handler 10. Such steeper angle further insures that the circuit boards 12 stack properly within the sleeve 40 in that the base boards 14 of some circuit boards 12 are sometimes irregularly shaped and do not stack well. The circuit boards 12 may be inserted directly into the front of the sleeve 40, or alternatively into the open top end thereof. Though not shown, it will be recognized that adjustable retention rails may be mounted to respective ones of the sidewalls of the sleeve 40 for assisting in maintaining the stacked circuit boards 12 therewithin, particularly if the sleeve 40 extends in generally perpendicular relation to the top surface 22, as shown in FIG. 15.

In the preferred embodiment, the sleeve 40 is releasably secured to the singulator mechanism 42, and more particularly to the singulator support blocks 44, via thumb screws so as to allow the sleeve 40 to be quickly and easily lifted off the singulator support blocks 44 for replacement of the sleeve 40 or easy access to the travel path of the circuit boards 12 through the handler 10. The releasable attachment of the sleeve 40 to the singulator support blocks 44 allows additional sleeves to be filled with stacked circuit boards 12 apart from the handler 10, and subsequently installed into the handler 10 when desired. When the sleeve 40 is properly secured to the singulator support blocks 44, the magazine assembly 38, and in particular the singulator mechanism 42 thereof, is specifically adapted to separate and deliver onto the top surface 22 one circuit board 12 at a time from the stack of circuit boards 12 stored within the sleeve 40.

The singulator mechanism 42 of the magazine assembly 38 further comprises a top pair of cylinders 50 which are attached to respective pairs of the pins 48 in opposed relation to each other via a top pair of adaptor blocks 52. The cylinders 50 of the top pair each include a reciprocal piston rod 54 extending axially therefrom. In this respect, the piston rods 54 of the cylinders 50 extend in coaxial alignment with each other when the cylinders 50 are properly mounted to the pins 48 via the adaptor blocks 52. The piston rods 54 are reciprocally movable inwardly and outwardly relative to respective ones of the cylinders 50 for reasons which will be discussed in more detail below.

As best seen in FIG. 16, each of the adaptor blocks 52 of the top pair includes two (2) apertures 52a extending laterally therethrough. In this respect, each of the apertures 52a defines an axis which is off-set at an angle of approximately 90 degrees from the axis defined by a respective piston rod 54. The apertures 52a are oriented such that each adaptor block 52 is slidably advancable over the upper two (2) pins 48 of each set extending laterally from a respective vertical wall portion 46 of a singulator support block 44. Each of the adaptor blocks 52 of the top pair may be easily withdrawn from upon a corresponding pair of the pins 48 when desired.

In addition to the top pair of cylinders 50, also attached to respective pairs of the pins 48 in opposed relation to each other via a bottom pair of adaptor blocks 53 is a bottom pair of cylinders 56. Like the cylinders 50 of the top pair, the cylinders 56 of the bottom pair each include a reciprocal piston rod 58 extending axially therefrom which is movable inwardly and outwardly relative to a respective one of the cylinders 56. The piston rods 58 also extend in coaxial alignment with each other when the cylinders 56 are properly mounted to the pins 48 via the adaptor blocks 53. In addition to being oriented in opposed relation to each other, the cylinders 56 of the bottom pair are also disposed in longitudinal or vertical alignment with respective ones of the cylinders 50 of the top pair due to the linear alignment of the pins 48 of each set with each other. In the preferred embodiment, the cylinders 50, 56 of the top and bottom pairs each comprise a pneumatic cylinder, though those of ordinary skill in the art will recognize that hydraulic cylinders may also be employed in the handler 10.

Like the top pair of adaptor blocks 52, the adaptor blocks 53 of the bottom pair each include two (2) apertures 53a extending laterally therethrough, with the axis defined by each aperture 53a extending at approximately a 90 degree angle relative to the axis defined by a respective piston rod 58. As will be recognized, the apertures 53a are also oriented such that each adaptor block 53 of the bottom pair is slidably advancable over the lower pair of pins 48 of each set extending laterally from a respective vertical wall portion 46 of a singulator support block 44. In the handler 10, the top pair of blocks 52 comprise parts of the top pair of cylinders 50, with the bottom pair of blocks 53 comprising parts of the bottom pair of cylinders 56. In this respect, the top and bottom pairs of cylinders 50, 56 are typically referred to as "block mount cylinders".

As best seen in FIGS. 12 and 13, the singulator mechanism 42 further comprises a top pair of blocks 60 which are attached to the distal ends of respective ones of the top pair of piston rods 54. In the preferred embodiment, each of the blocks 60 of the top pair defines a generally planar top surface 62 and a generally planar, vertically oriented front surface 64 having top and bottom edges. Extending angularly at an angle of approximately 45 degrees between the top surface 62 and the top edge of the front surface 64 is a sloped transitional surface 66. Additionally, extending along the bottom edge of the front surface 64 and extending generally perpendicularly relative thereto is a continuous retaining lip 68. The front facing edge of the retaining lip 68 has a beveled configuration, with the bottom surface of the retaining lip 68 being continuous with the bottom surface of the remainder of the block 60. The attachment of each block 60 to a respective piston rod 54 is facilitated by the extension of the distal end of the piston rod 54 into the approximate center of the generally planar back surface of the block 60. As will be recognized, the block 60 is actuated inwardly and outwardly relative to a respective cylinder 50 concurrently with the piston rod 54 to which it is attached.

In addition to the top pair of blocks 60, the singulator mechanism 42 includes a bottom pair of blocks 70 which are attached to the distal ends of respective ones of the piston rods 58 of the bottom pair of cylinders 56. In the preferred embodiment, the blocks 70 of the bottom pair each define a generally planar, vertically oriented front surface 72 having top and bottom edges. Extending along and extending forwardly from the bottom edge of the front surface 72 is a retaining flange 74 which defines a generally flat upper surface. The bottom surface of the retaining flange 74 is continuous with the bottom surface of the remainder of the block 70. The attachment of each block 70 to a respective piston rod 58 is facilitated by the extension of the distal end of the piston rod 58 into the approximate center of the generally planar back surface of the block 70. The bottom blocks 70 also move inwardly and outwardly relative to the cylinders 56 concurrently with the piston rods 58. When the top and bottom pairs of blocks 60, 70 are properly attached to the distal ends of the piston rods 54, 58, the back surfaces of each corresponding pair of the blocks 60, 70 extend in generally co-planar relation to each other, with the generally planar top surface of the block 70 extending in generally parallel relation to, and being spaced only slightly from, the bottom surface of the block 60.

Referring now to FIG. 12a, the bottom pair of cylinders 56 may alternatively be provided with a bottom pair of blocks 70a, each of which is attached to a respective piston rod 58. Each of the blocks 70a includes a vertically oriented front surface 72a which includes knurling formed thereon. The attachment of each block 70a to a respective piston rod 58 is facilitated by the extension of the distal end of the piston rod 58 into the approximate center of the generally planar back surface of the block 70a. When the top and bottom pairs of blocks 60, 70a are properly attached to the distal ends of the piston rods 54, 58, the back surfaces of each corresponding pair of the blocks 60, 70a extend in generally co-planar relation to each other, with the generally planar top surface of the block 70a extending in generally parallel relation to, and being spaced only slightly from, the bottom surface of the block 60. In the singulator mechanism 42 of the handler 10, the top and bottom pairs of blocks 60, 70, 70a of each pair are contained in corresponding openings defined within respective ones of the singulator support blocks 44. More particularly, each of these openings comprises the gap defined between the horizontal wall portion 45 and corresponding ear portion 47 of each singulator support block 44. Those or ordinary skill in the art will recognize that top and bottom pairs of blocks having alternative configurations for accommodating circuit boards of differing heights or irregular configurations may be employed in the handler 10 of the present invention.

During the process of singulation, the circuit boards 12 are stacked within the sleeve 40 in the previously described manner, such that the lowermost circuit board 12 contacts the bottom pair of blocks 70. In this respect, the bottom circuit board 12 of the stack extends longitudinally between the front surfaces 72 of the bottom pair of blocks 70, and is held directly against the retaining flanges 74. In the preferred embodiment, the widths of the blocks 70 of the bottom pair are equal to the average width of the base board 14 of a DIMM circuit board 12 so as to prevent the circuit board 12 from rotating within the blocks 70 when disposed therebetween. When the piston rods 58, and hence the bottom pair of blocks 70, are fully actuated toward each other, the distance separating the front surfaces 72 of the blocks 70 is substantially equal to, and only slightly exceeds, the longitudinal length of the base boards 14 of the circuit boards 12 which, as previously explained, are usually constant. As will be recognized, the tapered transitional surfaces 66 of the blocks 60 aid in directing and centering the stacked circuit boards 12 between the front surfaces 72 of the blocks 70.

After the circuit boards 12 have been stacked into the sleeve 40 such that the bottom circuit board 12 of the stack rests against the retaining flanges 74, the blocks 60 of the top pair are actuated toward each other so as to isolate a single circuit board 12 (i.e., the bottom circuit board 12 of the stack) between the top and bottom pairs of blocks 60, 70, and more particularly the retaining lips 68 and retaining flanges 74. The beveled, forwardly facing edges of the retaining lips 68 allow the same to be easily inserted between the adjacent circuit boards 12 when the top pair of blocks 60 are actuated toward each other to isolate the bottom circuit board 12 of the stack. As will be recognized, the spacing between the retaining lips 68 and retaining flanges 74 is specifically selected so as to allow only a single circuit board 12 to be isolated therebetween when the top pair of blocks 60 are actuated toward each other to isolate the bottom circuit board 12.

As with the front surfaces 72 of the bottom pair of blocks 70, the front surfaces 64 of the top pair of blocks 60 are separated from each other a distance which is substantially equal to, and only slightly exceeds, the longitudinal length of the base boards 14 when the top pair of blocks 60 are fully actuated toward each other and the lowermost circuit boards 12 of the stack (other than for the bottom, isolated circuit board 12) are positioned therebetween. The top pair of blocks 60 are preferably the same width as the bottom pair of blocks 70, thus also functioning to prevent the rotation of the circuit boards 12 between the front surfaces 64 thereof when fully actuated toward each other.

After the bottom circuit board 12 of the stack has been isolated in the aforementioned manner, the bottom pair of blocks 70 are actuated away from each other, thus causing the isolated circuit board 12 to be dropped onto another sub-assembly of the handler 10 which is attached to the housing 20 and extends between the singulator support blocks 44. When the bottom circuit board 12 of the stack is dropped, the remaining circuit boards 12 within the stack are held in place by the retaining lips 68 of the top pair of blocks 60. Since, as previously indicated, the distance separating the singulator support blocks 44 from each other is substantially equal to the longitudinal length of the base board 14 of each circuit board 12, the dropped circuit board 12 is prevented from rotating therebetween, and thus is maintained in generally parallel relation to the remaining circuit boards 12 of the stack within the sleeve 40. After the isolated circuit board 12 has been dropped, the bottom pair of blocks 70 are actuated back toward each other by the bottom pair of cylinders 56. The top pair of blocks 60 are then actuated away from each other by the cylinders 50 of the top pair so as to cause the stacked circuit boards 12, and in particular the bottom circuit board 12 of the stack, to drop into contact with the flat upper surfaces of the retaining flanges 74 of the bottom pair of blocks 70. The aforementioned steps are then repeated so as to cause the bottom circuit board 12 of the stack remaining within the sleeve 40 to be isolated between the top and bottom pairs of blocks 60, 70, and subsequently dropped onto another sub-assembly of the handler 10 which is attached to the housing 20.

In the preferred embodiment of the present invention, the top pair of blocks 60 are fabricated from stainless steel, with the bottom pair of blocks 70, 70a being fabricated from an aluminum-bronze alloy. The fabrication of the blocks 60, 70, 70a from these particular materials provides for many cycles of use over an extended period of time, with little resultant wear or the need for grease or other maintenance.

Though not shown, disposed within the singulator support blocks 44 of the magazine assembly 38 is a sensor which includes an optical transmitter and receiver pair. As the circuit boards 12 are dispensed from the magazine assembly 38 in the aforementioned manner, the isolated circuit board 12 will fall through and below the optical beam of the magazine assembly sensor. If two circuit boards 12 are improperly dispensed from the magazine assembly 38 instead of only one as intended or if a circuit board 12 does not lay flat after being dropped, the total height of the two circuit boards 12 or the non-flat board 12 will interfere with the optical beam, thus causing the handler 10 to generate an alarm as will be discussed in more detail below.

2. Transport Assembly

As best seen in FIGS. 3 and 5, the handler 10 constructed in accordance with the present invention further comprises a reciprocal transport assembly 88 which is attached to the top surface 22 of the housing 20 and is adapted to push the circuit board 12 dispensed from the singulator mechanism 42 of the magazine assembly 38 laterally into another sub-assembly of the handler 10. The transport assembly 88 pushes the circuit board 12 laterally relative to its longitudinal axis A.

In the preferred embodiment, the transport assembly 88 comprises a base plate 89 which is attached to the top surface 22 of the housing 20. The base plate 89 has a generally I-shaped cross-sectional configuration, and defines a substantially flat upper surface 90. The transport assembly 88 further comprises a pusher cylinder 91 which is attached to the top surface 22 of the housing 20 and includes a reciprocal piston rod 92 extending axially therefrom. Attached to the distal end of the piston rod 92 is a pusher plate 94 which is slidably movable along the upper surface 90 of the base plate and defines a frontal bumping edge 98. The actuation of the piston rod 92 inwardly and outwardly relative to the pusher cylinder 91 facilitates the lateral movement of the pusher plate 94, and hence the bumping edge 98. The pusher cylinder 91 also preferably comprises a pneumatic cylinder, though the same may alternatively comprise a hydraulic cylinder.

The width of the pusher plate 94, and hence the width of the bumping edge 98, is substantially equal to the longitudinal length of the base board 14 of the circuit board 12. As such, the pusher plate 94 is slidably movable between the singulator support blocks 44 when actuated by the pusher cylinder 91. In the transport assembly 88, both the pusher plate 94 and pusher cylinder 91 may be tilted upwardly relative to the upper surface 90 of the base plate 89 for allowing access to the travel path of the circuit board 12.

Though not shown, it is contemplated that the bumping edge 98 of the pusher plate 94 may be defined by a separate piece attached to the pusher plate 94, thus creating a pusher plate assembly consisting of two pieces and allowing for the adjustment or change-out of the frontal bumping edge. This alternative configuration of the pusher plate allows for the attachment of a bumping edge thereto which is of a length matching that of the particular circuit board 12 to be tested within the handler 10.

Referring now to FIG. 17, the transport assembly 88 may further comprise a spacer sheet 86 which is attached to the upper surface 90 of the base plate 89 and thus resides between the upper surface 90 and the pusher plate 94. The spacer sheet 86 is fabricated from a low-friction, anti-static material, and preferably polyethylene. More particularly, the spacer sheet 86 is preferably fabricated from ultra-high molecular weight (UHMW) polyethylene, though similar materials may be utilized as an alternative. The attachment of the spacer sheet 86 to the base plate 89, and in particular the upper surface 90 thereof, is preferably facilitated through the extension of fasteners such as screws into respective pairs of corresponding, coaxially aligned apertures disposed within the spacer sheet 86 and the base plate 89.

The spacer sheet 86 attached to the upper surface 90 is preferably of a particular height or thickness. Advantageously, the attachment of the spacer sheet 86 to the base plate 89 in the aforementioned manner allows the spacer sheet 86 to be selectively replaced with spacer sheets of differing heights or thicknesses for purposes of accommodating circuit boards of differing heights. In this respect, the height of the circuit board 12 varies according to the thickness of the memory chips 18 that are secured to the base board 14. As such, the spacer sheet 86 provides proper vertical alignment between the circuit board 12 and other sub-assemblies of the handler 10, as will be discussed in more detail below. For circuit boards of differing heights, the spacer sheet 86 is simply detached from the base plate 89 and replaced with a substitute spacer sheet of a differing thickness.

Access to the spacer sheet 86 for purposes of replacing the same with an alternative spacer sheet is facilitated by tilting the pusher plate 94 and pusher cylinder 91 upwardly relative to the upper surface 90 of the base plate 89, and hence the spacer sheet 86. Importantly, due to the pivotal connection of the pusher cylinder 91 to the housing 20 and the pivotal connection of the distal end of the piston rod 92 to the pusher plate 94, the bottom surface of the pusher plate 94 rests flush against the generally planar top surface of the spacer sheet 86 irrespective of the thickness thereof. As further seen in FIG. 17, the pusher plate 94 of the transport assembly 88 preferably includes a notch 96 formed within a front corner region thereof. In the transport assembly 88, the inclusion of the notch 96 within the pusher plate 94 is for purposes of accommodating one of the singulator support blocks 44 in the event the same is moved inwardly toward the other singulator support block 44 for purposes of accommodating a circuit board 12 of a lesser longitudinal length.

The pusher plate 94 of the transport assembly 88 is slidably moveable between the singulator support blocks 44 to facilitate the lateral movement of the cireuit board 12 positioned between the singulator support blocks 44 into another portion of the sub-assembly of the handler 10 onto which the circuit board 12 is dropped by the singulator mechanism 42. The inwardly facing surfaces of the singulator support blocks 44 are preferably polished to a mirror finish to minimize friction against the opposed longitudinal ends of the circuit board 12 and to prevent corners of the circuit board 12 from leaning up against the singulator support blocks 44 in the event the circuit board 12 bounces when dropped from the singulator mechanism 42 and is not laying flat.

The singulator support blocks 44 loosely guide the circuit board 12 dropped therebetween, with the spacing between the singulator support blocks 44 being such that there is approximately 0.040 inches clearance between each singulator support block 44 and a respective longitudinal end of the circuit board 12 to allow room for burrs or other debris on the ends of the circuit board 12. As will be discussed in more detail below, the handler 10 is provided with lateral and lower locators which facilitate the precise location of the circuit board 12 for testing purposes. The pusher plate 94 is sized so that there is a precision fit of the same between the singulator support blocks 44 when the pusher plate 94 is actuated to facilitate the lateral movement of the circuit board 12.

3. Testing Assembly

Referring now to FIGS. 3–10 and 17, each circuit board 12 is dispensed from the singulator mechanism 42 of the magazine assembly 38 onto the generally planar upper surface 138 of a pivoting shelf member 136 of a testing assembly 102 of the handler 10. The previously described transport assembly 88 of the handler 10 is adapted to push the circuit board 12 dispensed onto the upper surface 138 of the shelf member 136 laterally into a modular testing component 100 of a testing assembly 102 of the handler 10. The modular testing component 100 of the testing assembly 102 is removably attached to the top plate 24 of the housing 12 in a manner of which will be described in more detail below. The remaining components of the testing assembly 102 are attached to the housing 20, and more particularly to the top and back plates 24, 28 thereof. The modular testing component 100 interfaces the circuit boards 12 to a tester or testing module which is adapted to perform a desired testing protocol on the circuit boards 12 inserted into the modular testing component 100 by the transport assembly 88. As will also be discussed in more detail below, the modular testing component 100 is selectively removable from the testing assembly 102 and replaceable with an alternative modular testing component depending on whether DIMM or SIMM circuit boards are to be tested within the handler 10 and the type of DIMM or SIMM circuit boards to be tested.

As best seen in FIG. 6, the modular testing component 100 of the testing assembly 102 comprises an upper frame member 104 and a lower frame member 106. Disposed and rigidly captured between the upper and lower frame members 104, 106 is a guide member 108. In the preferred embodiment, the guide member 108 includes a pair of longitudinal locator slots 110 disposed in relative close proximity to respective ones of the opposed ends thereof. The longitudinal locator slots 110 are sized and configured to receive the opposed end portions of the base board 14 of each circuit board 12 pushed into the modular testing component 100 of the testing assembly 102 by the transport assembly 88. The height of the longitudinal locator slots 110 is substantially equal to, and only slightly exceeds, the thickness of the base board 14, thus preventing significant shifting of the circuit board 12 when inserted thereinto. To facilitate the ease of entry of the pushed circuit board 12 into the longitudinal locator slots 110, the open ends thereof which face the transport assembly 88 preferably have chamfered configurations. Disposed within the guide member 108 between each locator slot 110 and a respective one of the opposed ends thereof is a pair of locator apertures 112, the use of which will be described below.

As seen in FIGS. 6–8, each of the longitudinal locator slots 110 comprises a lower section 109 which has a downwardly sloped front end, and an upper section 111 which includes an upwardly sloped front end. Additionally, the guide member 108 defines an opposed pair of inwardly chamfered side edges 113, each of which is directed toward a respective one of the longitudinal locator slots 110. As previously indicated, the ease of entry of the pushed circuit board 12 into the longitudinal locator slots 110 is aided by the chamfered side edges 113 of the guide member 108 and the chamfered or sloped front ends of the lower and upper sections 109, 111 of the longitudinal locator slots 110.

As previously indicated, the singulator support blocks 44 only loosely guide the circuit board 12 dropped onto the shelf member 136 extending therebetween due to the clearance of approximately 0.040 inches between each longitudinal end of the circuit board 12 and a respective singulator support block 44. In this respect, all precision locating of the circuit board 12 within the modular testing component 100 of the testing assembly 102 is facilitated by the longitudinal locator slots 110 which precisely locate the circuit board 12 laterally, longitudinally, and vertically.

As the circuit board 12 is pushed laterally into the longitudinal locator slots 110 by the transport assembly 88, it contacts the chamfered front ends of the lower and upper sections 109, 111 of the longitudinal locator slots 110 and is guided upwardly into a precise vertical position within the modular testing component 100. In this respect, the lower sections 109 of the longitudinal locator slots 110 precisely locate the base board 14 of the circuit board 12 vertically within the modular testing component 100. Additionally, when the circuit board 12 contacts the closed back ends of the longitudinal locator slots 110 which act as stops, the circuit board 12 is placed into a precise lateral position within the modular testing component 100. The chamfered side edges 113 of the guide member 108 facilitate the guidance of the circuit board 12 into a precise longitudinal position within the modular testing component 100. In this respect, the side edges 113 transition into sections which extend in opposed, generally parallel relation to each other and are separated by a distance which only slightly exceeds the longitudinal length of the base board 14 of the circuit board 12. The upper sections 111 of the longitudinal locator slots 110 also aid in the vertical positioning of the base board 14 within the modular testing component 100. Importantly, due to the manner in which the longitudinal locator slots 110 and side edges 113 facilitate the alignment of the circuit board 12 within the modular testing component 100, there is no adjustment needed in the travel path of the circuit board 12 for differing board widths. Additionally, since the transport assembly 88 simply stops when the circuit board 12 is pushed against the closed back ends of the longitudinal locator slots 110, no precision timing is involved in the movement of the circuit board 12 into the modular testing component 100 of the testing assembly 102.

The guide member 108 of the modular testing component 100 further includes a central or lower locator member 114 which is disposed intermediate the longitudinal locator slots 110. The lower locator member 114 defines a notch 116 which is of the same height as the longitudinal locator slots 110 and extends in generally parallel relation thereto and in horizontal alignment therewith. The notch 116 is adapted to receive the base board 14 of the circuit board 12 pushed into the longitudinal locator slots 110, and is used as a further stop to limit the distance the circuit board 12 is pushed into the modular testing component 100 by the transport assembly 88. Additionally, the notch 116 is used to provide bottom support to the circuit board 12 and to confine the same vertically so that a bent circuit board 12 will not inadvertently contact and damage other components of the modular testing component 100.

In the modular testing component 100, the closed back ends of the longitudinal locator slots 110 which serve as stops for the circuit board 12 are defined by respective ones of a pair of precision ground, hardened steel pins 115 which are inserted into the guide member 108 at the deepest corner region of each longitudinal locator slot 110. The incorporation of the pins 115 into the modular testing component 100 allows base boards 14 which are out of tolerance on the high side to be tested within the modular testing component 100 without jamming and getting stuck in the longitudinal locator slots 110. The pins 115 also locate about the same center point as improperly sized base boards 14.

Figures 9, 10:
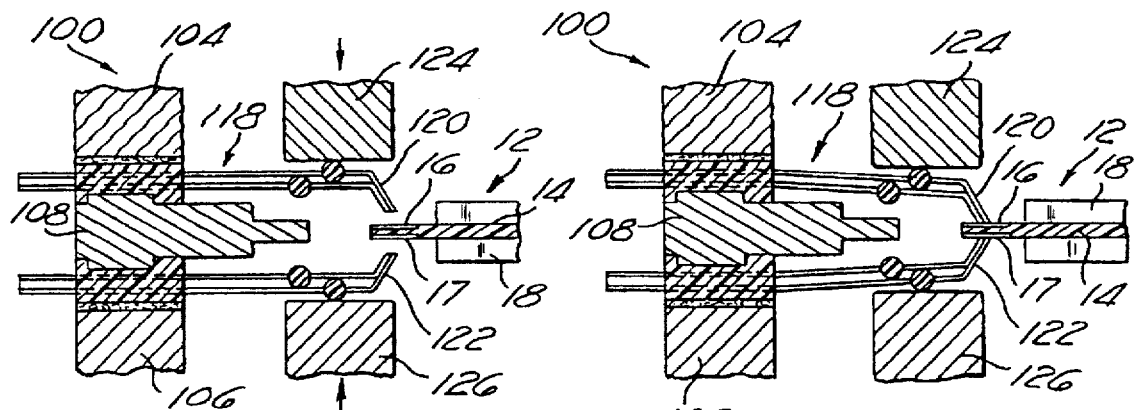
FIG. 9 is a cross-sectional view taken along line 9—9 of FIG. 8, illustrating the modular testing component in a loading position.
FIG. 10 is a cross-sectional view similar to FIG. 9, illustrating the modular testing component in a testing position.

The modular testing component 100 of the testing assembly 102 further comprises a test connector 118 which is disposed between the guide member 108 and the upper and lower frame members 104, 106. As best seen in FIGS. 6, 9 and 10, the test connector 118 includes an upper cantilevered set of flexible, resilient testing fingers 120 which extend from between the guide member 108 and the upper frame member 104. The upper set of testing fingers 120 is divided into two (2) linearly aligned rows, with each row extending longitudinally between the lower locator member 114 and a respective one of the longitudinal locator slots 110. In addition to the upper set of testing fingers 120, the test connector 118 includes a lower cantilevered set of flexible, resilient testing fingers 122 which extends from between the guide member 108 and the lower frame member 106. Like the upper set of testing fingers 120, the lower set of testing fingers 122 are also divided into two (2) linearly aligned rows, with each row extending longitudinally between the lower locator member 114 and a respective one of the longitudinal locator slots 110. Each of the testing fingers 122 of the lower set is also vertically aligned with a respective one of the testing fingers 120 of the upper set. Additionally, when the circuit board 12 is fully inserted into the longitudinal locator slots 110 of the guide member 108, the distal ends of the testing fingers 120 of the upper set are vertically aligned with respective ones of the connector pads 16 of the base board 14, with the distal ends of the testing fingers 122 of the lower set being vertically aligned with respective ones of the connector pads 17 of the base board 14.

As further seen in FIGS. 5, 9 and 10, portions of the test connector 118 protrude rearwardly from between the guide member 108 and the upper and lower frame members 104, 106. These rearwardly protruding portions of the test connector 118 are integrally connected to respective ones of the upper and lower sets of testing fingers 120, 122, and are used to electrically connect the testing fingers 120, 122 to a separate, external tester or testing module.

The testing fingers 120, 122 of the upper and lower sets are gold plated beryllium copper, with each set being held in place by a section of molded plastic which provides abutment surfaces for the clamping of the test connector 118 between the guide member 108 and the upper and lower frame members 104, 106. As previously indicated, the upper and lower sets of testing fingers 120, 122 are each provided in two (2) linearly aligned rows which are slightly separated and held in mutually electrically isolated relation to each other. The upper and lower sets of testing fingers 120, 122 cantilever freely relative to their corresponding solid plastic sections of the test connector 118, thus allowing the testing fingers 120, 122 to be bent or flexed to achieve electrical contact with respective ones of the connector pads 16, 17 of the base board 14. The ends of the test connector 118 opposite the upper and lower sets of testing fingers 120, 122 protrude a shorter distance from the molded plastic sections, and are those portions of the test connector 118 which protrude rearwardly from the guide member 108 and upper and lower frame members 104, 106 as shown in FIGS. 5, 9 and 10. These portions of the test connector 118 are rigidly constructed and are adapted to be plugged into a test equipment connector for electrical connection to a tester or directly into a separate tester or testing module. In the preferred embodiment, the orientation of the test connector 118 between the guide member 108 and upper and lower frame members 104, 106 can be laterally adjusted. Such adjustability allows for a change in the position of the distal ends of the upper and lower sets of testing fingers 120, 122 as needed to facilitate the precise alignment thereof with the connector pads 16, 17 of the base board 14 for the particular circuit board 12 being tested in the handler 10.

To facilitate the performance of the testing protocol on the circuit board 12, the upper and lower sets of testing fingers 120, 122 of the test connector 118 must be placed into electrical contact with respective ones of the connector pads 16, 17 of the base board 14. Since the distal ends of the testing fingers 120, 122 are normally disposed in spaced relation to the connector pads 16, 17, of the circuit board 12 inserted into the guide member 108 of the modular testing component 100, the testing fingers 120 of the upper set must be flexed downwardly into contact with the connector pads 16, with the testing fingers 122 of the lower set having to be flexed upwardly into contact with the connector pads 17.

To facilitate the downward flexion of the testing fingers 120 of the upper set into contact with the connector pads 76, the testing assembly 102 further comprises an upper actuation bar 124 which is pivotally connected to back plate 28 and partially resides within the opening 31 therein. The upper actuation bar 124 is preferably fabricated from polycarbonate or aluminum. In the preferred embodiment, the upper actuation bar 124 is selectively movable between a loading position (as shown in FIG. 9) whereat the upper actuation bar 124 extends laterally above and across the upper set of testing fingers 120, and a testing position (as shown in FIG. 10) whereat the upper actuation bar 124 applies downward pressure to the upper set of testing fingers 120, thus flexing the same into contact with respective ones of the connector pads 16. As will be recognized, the movement of the upper actuation bar 124 from its testing position back to its loading position allows the testing fingers 120 of the upper set to resiliently return to their normal, unflexed orientations in spaced relation to the connector pads 16 of the base board 14.

To facilitate the upward flexion of the testing fingers 122 of the lower set into contact with the connector pads 17, the testing assembly 102 also includes a lower actuation bar 126 which is pivotally connected to the back plate 28 and partially resides within the opening 31 therein. The lower activation bar 126 is also preferably fabricated from polycarbonate or aluminum. The lower actuation bar 126 is itself selectively movable between a loading position (as shown in FIG. 9) whereat the lower actuation bar 126 extends laterally below and across the lower set of testing fingers 122, and a testing position (as shown in FIG. 10) whereat the lower actuation bar 126 applies upward pressure to the lower set of testing fingers 122, thus flexing the same into contact with respective ones of the connector pads 17. The movement of the lower actuation bar 126 from its testing position back to its loading position allows the testing fingers 122 of the lower set to resiliently return to their normal, unflexed orientations in spaced relation to the connector pads 17 of the base board 14.

The movement of the upper actuation bar 124 between its loading and testing positions is facilitated by an upper actuation bar cylinder 128 attached to the portion of the back plate 28 of the housing 20 extending perpendicularly upward from the top surface 22 of the top plate 24. Extending axially from the upper actuation bar cylinder 128 is a reciprocal piston rod 130, the distal end of which is selectively abuttable against to the approximate center of the upper actuation bar 124. The movement of the piston rod 130 outwardly relative to the upper actuation bar cylinder 128 facilitates the movement of the upper actuation bar 124 from its loading position to its testing position. Conversely, the movement of the piston rod 130 inwardly relative to the upper actuation bar cylinder 128 facilitates the return of the upper actuation bar 124 to its loading position.

The movement of the lower actuation bar 126 between its loading and testing positions is facilitated by a lower actuation bar cylinder 132 which is disposed within the interior of the housing 20 and attached to the inner surface of the back plate 28. Extending axially from the lower actuation bar cylinder 132 is a reciprocal piston rod 134 which protrudes from an opening formed within the top plate 24. The distal end of the piston rod 134 is selectively abuttable against to the approximate center of the lower actuation bar 126. The movement of the piston rod 134 outwardly relative to the lower actuation bar cylinder 132 facilitates the movement of the lower actuation bar 126 from its loading position to its testing position. Conversely, the movement of the piston rod 134 inwardly relative to the lower actuation bar cylinder 132 facilitates the return of the lower actuation bar 126 to its loading position. The upper and lower actuation bar cylinders 128, 132 preferably comprise pneumatic cylinders.

In the preferred embodiment, extending between respective ones of the upper and lower actuating bars 124, 126 and the back plate 28 of the housing 20 are pairs of biasing springs 127, as best seen in FIG. 3. In this respect, the upper and lower actuation bars 124, 126 are each returned to their loading positions by the biasing force applied thereto by the biasing springs 127 when the piston rods 130, 134 are moved inwardly relative to the upper and lower actuation bar cylinders 128, 132, respectively.

Referring now to FIG. 7, in the preferred embodiment of the present invention the modular testing component 100 is removably attached to the top plate 24 of the housing 12. The top plate 24 includes a pair of internally threaded locator apertures 148 and a pair of locator pins 150 which extend upwardly therefrom. To facilitate the attachment of the modular testing component 100 to the top plate 24, the locator pins 150 are slidably inserted into respective ones of the frontal locator apertures 112 disposed within the opposed end portions of the guide member 108. When the locator pins 150 are received into the frontal locator apertures 112, the rear locator apertures 112 of the guide member 108 are coaxially aligned with respective ones of the internally threaded locator apertures 148 of the top plate 24. Fasteners 152 such as screws are extended through the coaxially aligned sets of apertures 112, 148 thus facilitating the rigid attachment of the modular testing component 100 to the top plate 24. When the guide member 108 of the modular testing component 100 is attached to the top plate 24 in the aforementioned manner, the upper and lower frame members 104, 106 of the modular testing component 100 reside within the opening 31 of the back plate 28 of the housing 20.

As previously indicated, the modular testing component 100 of the testing assembly 102 is removably attached to the top plate 24 of the housing 12, and is selectively replaceable with an alternative modular testing component. In this respect, the modular testing component 100 is specifically configured to accommodate DIMM circuit boards, with the alternatively configured modular testing component being configured to accommodated SIMM circuit boards. Such alternative modular testing component is identically configured to the previously described modular testing component 100, but does not include the lower set of testing fingers 122. The alternative modular testing component includes only one set of testing fingers which extend from between the guide member and the upper frame member thereof. The upper actuation bar 124 of the testing assembly 102 is operable to move the testing fingers of the alternative modular testing component between the previously described loading and testing positions for facilitating the downward flexion of the testing fingers of the alternative modular testing component into contact with the connector pads of a SIMM circuit board inserted thereinto. The alternative modular testing component, and in particular the guide member thereof, is attached to the singulator support blocks 44 in the same manner as previously described in relation to the modular testing component 100.

Figure 11:
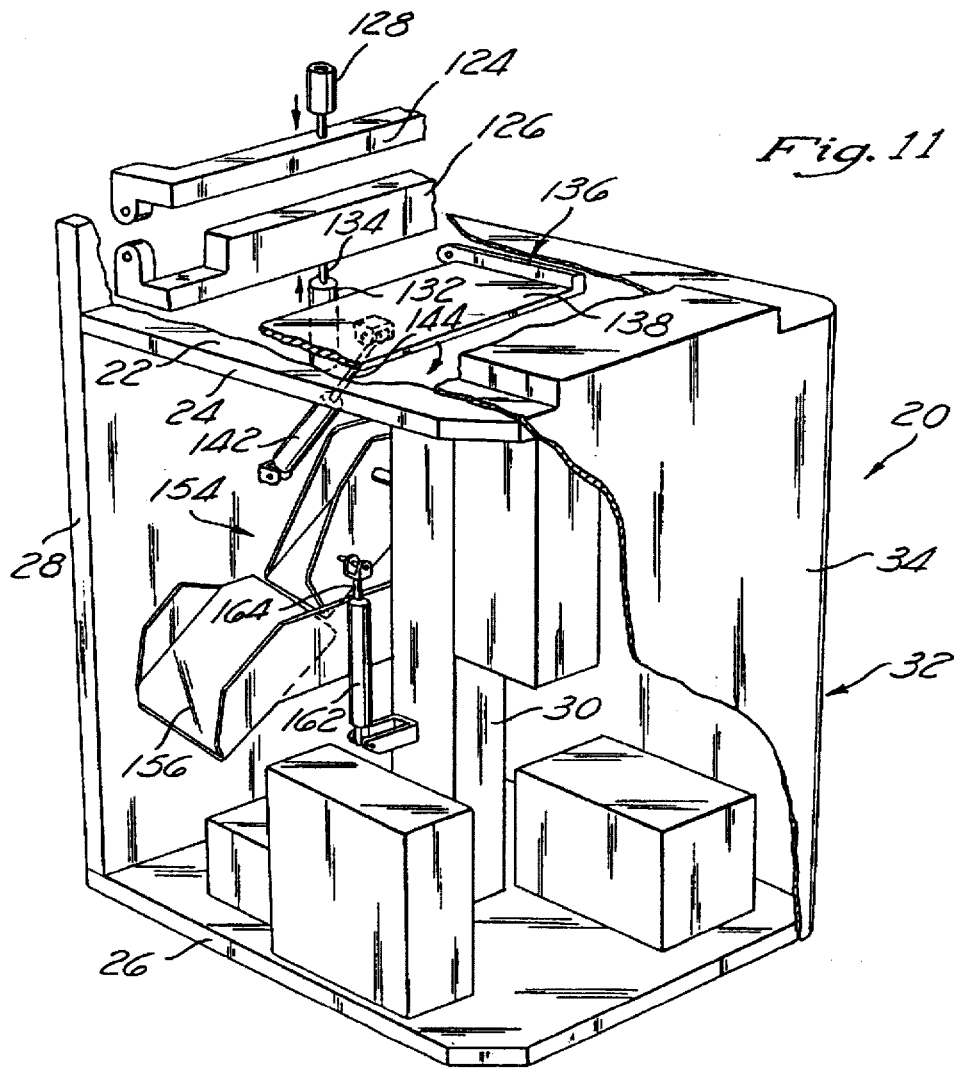
FIG. 11 is a front, partial perspective view of the testing and sorting assemblies of the handler/testing apparatus.

Referring now to FIGS. 3, 11 and 14, as previously indicated, the testing assembly 102 comprises the shelf member 136 which is pivotally connected to the top plate 24 and defines the generally planar upper surface 138. Attached to the upper surface 138 is a spacer sheet 140. The spacer sheet 140, like the spacer sheet 86, is fabricated from a low-friction, anti-static material, and preferably ultra-high molecular weight (UHMW) polyethylene, though similar materials may be employed as an alternative. The spacer sheet 140 is itself releasably attached to the upper surface 138 of the shelf member 136 so as to allow for the selective replacement thereof with spacer sheets of differing heights or thicknesses to accommodate circuit boards 12 of differing heights. As seen in FIG. 17a, the spacer sheets 86, 140 attached to the base plate 89 and shelf member 136, respectively, are of equal thickness, thus causing the generally planar top surfaces thereof to extend in generally co-planar relation to each other. Such alignment of the top surfaces of the spacer sheets 86, 140 allows for the smooth transition of the pusher plate 94 of the transport assembly 88 from the spacer sheet 86 onto the spacer sheet 140 for purposes of pushing the circuit board 12 laterally along the spacer sheet 140 into the longitudinal locator slots 110 of the modular testing component 100 of the testing assembly 102. As previously indicated, the spacer sheets 86, 140 may be replaced by spacer sheets of differing thicknesses as is needed to properly elevate the circuit board 12 to a location wherein the opposed longitudinal end portions of the circuit board 12 are properly aligned with the longitudinal locator slots 110 of the modular testing component 100.

Referring now to FIG. 17a, spacer sheets 86a, 140a may be included in the handler 10 and attached to the base plate 89 and shelf member 136, respectively, as an alternative to the previously described spacer sheets 86, 140. The spacer sheets 86a, 140a are identical to the previously described spacer sheets 86, 140, except for the additional inclusion of elongate channels therein which are aligned with each other when the spacer sheets 86a, 140a are attached to the base plate 89 and shelf member 136. The additional inclusion of the channels within the spacer sheets 86a, 140a is for purposes of accommodating memory chips 18 or other components of the circuit board 12 which protrude excessively therefrom beyond other components. As previously indicated, the spacer sheet 140, 140a is disposed and extends between the singulator support blocks 44, with the circuit board being dispensed thereon from the magazine assembly 38.

The shelf member 136 is pivotally movable between a first position (as shown in FIGS. 3 and 11) whereat the spacer sheet 140 extends in generally co-planar relation to the spacer sheet 86 applied to the top surface 22, and a second position (as shown in FIG. 14) whereat the spacer sheet 140 slopes downwardly away from the spacer sheet 86. When the shelf member 136 is actuated to its second position, the same extends into the interior of the housing 20 via an opening disposed within the top plate 24.

When the circuit board 12 is pushed into the guide member 108 of the modular testing component 100 by the transport assembly 88, the circuit board 12 is advanced laterally along the spacer sheet 140 which, as previously indicated, is normally disposed in co-planar relation to the spacer sheet 86. As the circuit board 12 slides over the spacer sheet 140, the same is loosely guided along its opposed sides by the inwardly facing surfaces of the singulator support blocks 44 of the magazine assembly 38. The spacer sheet 140 extends substantially beyond the chamfered open ends of the longitudinal locator slots 110. As such, when the opposed end portions of the base board 14 are fully received into the longitudinal locator slots 110, the memory chips 18 on the lower surface of the base board 14 of the circuit board 12 still rest upon the spacer sheet 140.

As previously indicated, the heights of the spacer sheets 86, 140 relative to the upper surface 90 and upper surface 138 are selected so as to horizontally align the opposed end portions of the base board 14 with the longitudinal locator slots 110, as well as the notch 116 of the lower locator member 114. Additionally, when the circuit board 12 is fully received into the longitudinal locator slots 110, the longitudinal edge of the base board 14 opposite that including the connector pads 16, 17 extends between the inwardly facing surfaces of the singulator support blocks 44.

As seen in FIG. 1, the connector pads 16, 17 do not extend along the entire length of the back longitudinal edge of the base board 14, but rather terminate inwardly relative to respective ones of the opposed ends thereof, with the connector pads 16, 17 being separated in the approximate center of the base board 14 by the notch 15. As previously explained, the opposed end portions of the base board 14 which are devoid of the connector pads 16, 17 are received into respective ones of the longitudinal locator slots 110. Additionally, the notch 15 and a portion of the base board 14 extending laterally therefrom are received into the lower locator member 114. As such, those areas of the circuit board 12 which are used to facilitate the proper locating of the base board 14 within the modular testing component 100 of the testing assembly 102 are devoid of connector pads 16, 17, thus avoiding the inadvertent grounding of the circuit board 12 to the handler 10 due to contact between the handler 10 and the connector pads 16, 17.

Referring now to FIGS. 11 and 14, to facilitate the movement of the shelf member 136 between its first and second positions, disposed within the interior of the housing 20 and pivotally connected to the inner surface of the back plate 28 is a shelf cylinder 142 having a reciprocal piston rod 144 extending axially therefrom. The distal end of the piston rod 144 is itself pivotally connected to the approximate center of the lower surface of the shelf member 136. As will be recognized, the movement of the piston rod 144 inwardly relative to the shelf cylinder 142 facilitates the movement of the shelf member 136 from its first position to its second position. Conversely, the movement of the piston rod 144 outwardly relative to the shelf cylinder 142 facilitates the return of the shelf member 136 to its first position. The shelf cylinder 142 also preferably comprises a pneumatic cylinder.

When in their normal, unflexed orientations, the distal ends of the upper and lower sets of testing fingers 120, 122 are preferably only slightly spaced from the connector pads 16, 17 of the circuit board 12. Such minimal spacing is to allow the testing fingers 120, 122 to be placed into contact with the connector pads 16, 17 with only a slight amount of bending or flexion thereof so as to minimize metal fatigue in the testing fingers 120, 122. Since the inadvertent contact between the circuit board 12 and the testing fingers 120, 122 during the insertion of the circuit board 12 into the modular testing component 100 of the testing assembly 102 could cause significant damage to the testing fingers 120, 122, it is extremely important to properly orient the base board 14 vertically relative to the testing fingers 120, 122. Additionally, to insure the proper alignment between the testing fingers 120, 122 and the connector pads 16, 17, the base board 14 must also be properly oriented laterally and longitudinally relative to the testing fingers 120, 122. As previously explained, such locating is accomplished by the combination of the singulator support blocks 44, longitudinal locator slots 110, lower locator member 114, and spacer sheets 86, 140.

Though not shown, the lower locator member 114 may also be provided with a center pin, with the final precision lateral alignment of the circuit board 12 within the modular testing component 100 being created by such pin acting on the notch 15 within the circuit board 12. Such a modified design would facilitate precision lateral positioning of the circuit board 12 within the modular testing component 100, and would allow oversized circuit boards 12 to run without jamming, and undersized circuit boards 12 to be accurately located.

Since the confinement of the circuit board 12 within the modular testing component 100 laterally, longitudinally, and vertically is facilitated by the fixed longitudinal locator slots 110 and lower locator member 114, the relative position of the circuit board 12 to the testing fingers 120, 122 which is critical for successful testing never changes. This is made possible only by the lateral movement or loading of the circuit board 12 into the longitudinal locator slots 110 and lower locator member 114, and the subsequent backing out of the circuit board 12 therefrom, since with prior art unidirectional movement, retracting stops are required.

4. Sorting Assembly

Referring now to FIGS. 2, 3, 11 and 14, the handler 10 constructed in accordance with the present invention further comprises a sorting assembly 154 which is disposed within and attached to the housing 20 for selectively directing the tested circuit board 12 into a particular bin or containment vessel based upon the outcome of the testing protocol performed upon the circuit board 12 by the modular testing component 100. As will be discussed in more detail below, the testing assembly 102, and in particular the shelf member 136 thereof, is adapted to eject the circuit board 12 into the sorting assembly 154 subsequent to the completion of the testing protocol.

The sorting assembly 154 comprises a pair of exit chutes 156 which are attached to the housing 20, and are angled downwardly toward respective ones of an opposed pair of openings 158 disposed within the sidewalls 36 of the cover member 32. Pivotally connected to the housing 20, and in particular to the support bar 30 thereof, is a tilt tray 160. The tilt tray 160 is movable between a first position (as shown in FIGS. 11 and 14) and a second position (as shown in phantom in FIG. 14) whereat the tilt tray 160 is linearly aligned with respective ones of the exit chutes 156. When aligned with a particular exit chute 156, the bottom wall of the tilt tray 160 is substantially continuous with and extends in generally coplanar relation to the bottom wall of the exit chute 156, as best seen in FIGS. 11 and 14.

The movement of the tilt tray 160 between its first and second positions is facilitated by a tilt cylinder 162 which is preferably attached to the support bar 30 of the housing 20. The tilt cylinder 162 includes a reciprocal piston rod 164 extending axially therefrom, the distal end of which is pivotally connected to the tilt tray 160. Since the tilt tray 160 is pivotally connected to the support bar 30 along its lateral center line, the movement of the piston rod 164 inwardly relative to the tilt cylinder 162 causes the tilt tray 160 to be pivoted/rotated into alignment with one of the exit chutes 156 of the pair. Conversely, the movement of the piston rod 164 outwardly relative to the tilt cylinder 162 causes the tilt tray 160 to be pivoted/rotated into alignment with the other exit chute 156 of the pair. The tilt cylinder 162 also preferably comprises a pneumatic cylinder, though the same may alternatively comprise a hydraulic cylinder.

Subsequent to the completion of the testing protocol, the tested circuit board 12 is ejected from the testing assembly 102 into the sorting assembly 154. More particularly, the shelf member 136 is actuated from its first position to its second position wherein the same is angled downwardly into the interior of the housing 20. As previously indicated, the circuit board 12, and in particular the memory chips 18 thereof, are maintained upon the spacer sheet 140 of the shelf member 136 when the circuit board 12 is fully received into the modular testing component 100 of the testing assembly 102. Additionally, only a relatively small portion of the lateral width of the opposed end portions of the base board 14 is inserted into the locator slots 110. As such, the actuation of the shelf member 136 to its second position causes gravity to remove the circuit board 12 from within the guide member 108 of the modular testing component 100, with the circuit board 12 sliding along the downwardly sloping spacer sheet 140 of the shelf member 136 and into the interior of the housing 20 via the opening formed in the top plate 24 thereof.

As seen in FIG. 7, to aid in the ejection of the circuit board 12 from within the guide member 108 subsequent to the completion of the testing protocol, the shelf member 136 is preferably provided with an ejector tab 137 extending therefrom. In this respect, during the movement of the shelf member 136 from its first position to its second position, the ejector tab 137 acts against the rear longitudinal edge of the base board 14, thus pushing the circuit board 12 out from within the locator slots 110 of the guide member 108.

Referring now to FIG. 7a, the testing assembly 102 of the handler 10 may be provided with an alternative shelf member 136a including at least one ejector tab 137a which is releasably attached thereto and selectively positionable at various locations along one longitudinal edge thereof. More particularly, the alternative shelf member 136a is provided with a plurality of slots 170 which extend laterally from the back longitudinal edge of the shelf member 136a in equidistantly spaced relation to each other. Disposed adjacent each slot 170 is a corresponding aperture 172. The ejector tab 137a is slidably advancable into a respective one of the slots 170. The ejector tab 137a includes an ear portion 174 extending laterally from one side thereof which includes an aperture 176 disposed therein. When the ejector tab 137a is inserted into a respective slot 170, the aperture 176 of the ear portion 174 is coaxially aligned with a corresponding aperture 172. The advancement of a fastener through such coaxially aligned apertures facilitates the rigid attachment of the ejector tab 137a to the shelf member 136a. As will be recognized, the ejector tab(s) 137a may be attached to the shelf member 136a at differing locations depending upon the longitudinal length of the circuit board 12 tested within the handler 10.

As further seen in FIG. 14, when in its second position, the shelf member 136 is aligned with the tilt tray 160 of the sorting assembly 154. As such, the circuit board 12 is caused to slide off of the spacer sheet 140 of the shelf member 136 and onto the bottom wall of the tilt tray 160. Once dispensed onto the bottom wall of the tilt tray 160, the force of gravity causes the circuit board 12 to slide downwardly into the exit chute 156 of the pair with which the tilt tray 160 is aligned based upon the position of the piston rod 164 of the tilt cylinder 162. After passing through one of the exit chutes 156, the circuit board 12 falls into one of a pair of bins or containment vessels 166 (shown in phantom in FIG. 4) disposed on either side of the handler 10. As will be discussed in more detail below, the tilt direction of the tilt tray 160, and hence the containment vessel 166 into which the circuit board 12 is ultimately placed, is dependant upon the outcome of the testing protocol performed upon the circuit board 12 by the modular testing component 100 of the testing assembly 102.

The exit chutes 156 and tilt tray 160 preferably comprise troughs having angled sides which force the circuit board 12 deeper into the corners thereof. This particular configuration of the exit chutes 156 and tilt tray 160 causes the circuit board 12 to move in the selected pathway into and through the exit chutes 156.

As previously indicated, each of the exit chutes 156 is also preferably provided with a chute sensor which is positioned at the exit end thereof. The chute sensor directs an optical beam into the pathway of the circuit board 12 through the exit chute 156 so as to sense whether the circuit board 12 has exited the proper exit chute 156 based upon the outcome of the testing protocol. As will also be discussed in more detail below, if the chute sensors are not triggered according to the sort signal received from the modular testing component 100 of the testing assembly 102, the handler 10 will automatically stop operation.

5. Actuation and Control Components

As previously indicated, all movement of the various sub-assemblies in the handler 10 is preferably facilitated through the use of pneumatic cylinders. These cylinders are preferably powered by 60 PSI pressurized air, with the air being routed through pneumatic tubing into solenoid control valves and subsequently into the various cylinders. Flow controls are also provided to create smooth, even travel of the cylinder piston rods. However, as also previously indicated, those of ordinary skill in the art will recognize that other types of components, such as hydraulic cylinders, may be employed in the handler 10 to facilitate the actuation or movement of the various sub-assemblies thereof.

The handler 10 of the present invention is also preferably powered by a 60 cycle, 110 VAC single phase electrical supply source or local equivalent thereto. An internal power supply assembly disposed within the interior of the housing 20 converts the alternating voltage to DC for use in powering the solenoid valves, sensors and controls as required for the proper operation of the handler 10.

All the operational aspects of the handler 10, and its various modes of operation, are controlled by a programmable logic controller (PLC) which is also disposed within the interior of the housing 20. Those of ordinary skill in the art will also recognize that a customized solid state logic circuit may be used as an alternative to the controller. The controller is electrically connected to the solenoid valves and sensors of the handler 10 as well as to an external tester or testing module (sold by various other companies) which is itself electrically connected to the test connector 118 and adapted to perform the testing protocol upon the circuit board 12 disposed within the modular testing component 100 of the testing assembly 102.

6. Handler Operation

Having thus described the structural and functional attributes of the various sub-assemblies of the handler 10, the overall operation thereof will now be described. Initially, a plurality of circuit boards 12 to be tested are stacked into the sleeve 40 of the magazine assembly 38 either prior or subsequent to the receipt thereof into the singulator support blocks 44 mounted to the housing 20. After the sleeve 40 has been inserted into the singulator support blocks 44 and loaded with stacked circuit boards 12, the singulator mechanism 42 is actuated in the previously described manner so as to cause a single circuit board 12 to be dispensed onto the spacer sheet 104 attached to the upper surface 138 of the shelf member 136 disposed and extending between the singulator support blocks 44. As previously indicated, the circuit boards 12 are oriented in the magazine assembly 38 such that the connector pads 16, 17 are directed toward the modular testing component 100 of the testing assembly 102.

Subsequent to the single circuit board 12 being dispensed onto the spacer sheet 104, the transport assembly 88, and more particularly the pusher cylinder 91, is actuated by the controller, thus causing the pusher plate 94 to be moved laterally along the spacer sheets 86, 104 toward the circuit board 12. The longitudinal edge of the base board 14 not including the connector pads 16, 17 therealong is contacted by the bumping edge 98 of the pusher plate 94, with circuit board 12 then being pushed laterally by the pusher plate 94 along the spacer sheet 104 and into the modular testing component 100 of the testing assembly 102, and in particular the longitudinal locator slots 110 and lower locator member 114 of the guide member 108 thereof. Once the circuit board 12 has been fully inserted into the modular testing component 100, the controller causes the pusher cylinder 91 of the transport assembly 88 to retract the pusher plate 94 back to its original position.

As the circuit board 12 is dispensed from the magazine assembly 38 onto the spacer sheet 104, the same falls through and below the optical beam of the magazine assembly sensor included on the singulator support blocks 44. As the circuit board 12 passes through the optical beam, the controller receives a signal that the circuit board 12 has, in fact, moved from the magazine assembly 38 into its appropriate position upon the spacer sheet 104. If two (2) circuit boards 12 are improperly dispensed from the magazine assembly 38 instead of only one as intended or if the dispensed circuit board 12 is not laying flat, the total height of the two (2) circuit boards 12 or non-flat circuit board 12 will interfere with the optical beam of the magazine assembly sensor, thus causing the controller of the handler 10 to generate an alarm in the form of either an audible signal or the activation of a failure light.

Once the circuit board 12 has been properly inserted into the modular testing component 100 of the testing assembly 102, the connector pads 16, 17 thereof are in proper alignment with respective ones of the testing fingers 120, 122 of the upper and lower sets. Thereafter, the controller causes the upper and lower actuation bars 124, 126 to be moved from their loading positions to their testing positions, thus facilitating the flexion of the testing fingers 120, 122 into electrical contact with the connector pads 16, 17. When electrical connection is made between the testing fingers 120, 122 and their corresponding connector pads 16, 17, the controller of the handler 10 generates a signal to the tester or testing module electrically connected to the modular testing component 100 to initiate the testing protocol upon the circuit board 12 within the modular testing component 100.

Subsequent to the completion of the testing protocol, the testing module sends a "pass" or "fail" signal to the controller based upon the test results. The controller then causes the upper and lower actuation bar cylinders 128, 132 to allow for the spring biased movement of the upper and lower actuation bars 124, 126 from their testing positions back to their loading positions, thus allowing the testing fingers 120, 122 to resiliently return to their unflexed orientations in spaced relation to the connector pads 16, 17. Thereafter, the controller causes the shelf cylinder 142 to facilitate the actuation of the shelf member 136 from its first position to its second position, thus causing the circuit board 12 to be ejected from within the modular testing component 100 of the testing assembly 102 in the aforementioned manner.

After being ejected from the testing assembly 102, the tested circuit board 12 is directed into the tilt tray 160 of the sorting assembly 154. Immediately prior to the circuit board 12 being ejected into the sorting assembly 154, the controller causes the tilt cylinder 162 to actuate the tilt tray 160 into alignment with a respective one of the exit chutes 156 depending on whether a "pass" or "fail" signal has been generated by the testing module. As such, the tested circuit board 12 will be directed into one of the containment vessels 166 depending upon the outcome of the testing protocol. As will be recognized, one of the containment vessels 166 is intended to receive circuit boards 12 which have passed the test, with the other containment vessel 166 being adapted to receive those circuit boards 12 which have failed the test. As previously indicated, rather than being placed into the containment vessels 166, the tested circuit boards 12 may also be dropped onto a ramp or an automated transport system such a conveyor for subsequent production operations.

As previously indicated, the tilt tray 160 is actuated to one of its first and second positions depending upon the outcome of the testing protocol, thus facilitating the placement of the tested circuit board 12 into the appropriate containment vessel 166. Between cycles of the circuit board handler 10 and when the same is deactivate (i.e., the power is turned off), the tilt tray 160 also defaults to a position in alignment with that exit chute 156 which is directed toward the containment vessel 166 accommodating failed circuit boards 12 so as to ensure that if a malfunction of the handler 10 occurs, the circuit boards 12 will sort to the fail direction.

As the circuit boards 12 pass through respective ones of the exit chutes 156, the chute sensors located on the exit ends thereof are adapted to verify that the circuit boards 12 are being dropped into the proper containment vessels 166. In this respect, if the chute sensors are not triggered according to the sort signal generated to the controller by the testing module, the controller will automatically stop the operation of the handler 10, with a programmed error action being initiated by the controller.

The previously described manner of operation of the handler 10 is substantially the same when the alternative modular testing component is integrated into the testing assembly 102 thereof. In this respect, the circuit board 12 is pushed into the alternative modular testing component by the transport assembly 88, with the testing fingers of the alternative modular testing component being flexed into contact with the connector pads of the SIMM circuit board via the movement of the upper actuation bar 124 from its loading position to its testing position. Subsequent to the completion of the testing protocol upon the SIMM circuit board, the same is ejected from within the alternative modular testing component in the same manner as previously described in relation to the modular testing component 100, with the tested circuit board then being directed into the sorting assembly 154 and placed into the appropriate containment vessel 166 based upon the outcome of the test.

In the handler 10 of the present invention, the movement of the circuit board 12 into the testing assembly 102 occurs laterally rather than longitudinally relative to its longitudinal axis A. Due to this direction of movement, the handler 10 has a compact overall configuration, and is significantly less complex in design and operation, and is far more versatile, than those known in the prior art. Indeed, in the handler 10, the path of each circuit board 12 therethrough is extremely short in all directions, thus adding to the small profile thereof.

As previously explained, the handler 10 constructed in accordance with the present invention is adapted to test either DIMM circuit boards or SIMM circuit boards. In this respect, the modular testing component 100 will be integrated into the testing assembly 102 of the handler 10 if DIMM circuit boards 12 are to be tested therewithin. In the event SIMM circuit boards are to be tested within the handler 10, the modular testing component 100 is removed from within the handler 10, and replaced with the alternative modular testing component. The changeover between the modular testing components is accomplished in an extremely rapid and easy manner. Additionally, such interchangability provides greater utility to the handler 10 by expanding its range of testing applications.

Additional modifications and improvements of the present invention may also be apparent to those of ordinary skill in the art. For example, the containment vessels 166 may be located on the same side of the housing 20, rather than at opposite sides thereof. In this regard, the exit chutes 156 may be disposed in a vertically aligned configuration, with the tilt tray 160 being adapted to tilt to a desired degree for moving the circuit boards 12 into the correct exit chute 156. Similarly, the handler 10 could be modified to eject the tested circuit board 12 out of the front thereof instead of from its sides. Additionally, the tilt tray 160 can be sized so as to eliminate the need to include the exit chutes 156. Further, certain ones of longitudinal, lateral and vertical locating fixtures of the handler 10 may be eliminated by sloping or angling certain components of the handler 10 in a manner wherein gravity forces each circuit board 12 into a consistent location within the modular testing component 100. As such, the particular combination of parts described and illustrated herein is intended to represent only one embodiment of the present invention, and is not intended to serve as limitations of alternative devices within the spirit and scope of the invention.

What is claimed is:

1. A circuit board handling and testing apparatus, comprising:
    a housing defining a top surface;
    a magazine assembly attached to the housing for accommodating a plurality of circuit boards and dispensing the circuit boards one at a time, each of the circuit boards defining a longitudinal axis;
    a testing assembly attached to the housing, said magazine assembly dispensing the circuit boards one at a time onto the testing assembly which includes a modular testing component for receiving the circuit board dispensed onto the testing assembly and performing a testing protocol thereon, said modular testing component being selectively removable from the testing assembly and replaceable with an alternative modular testing component;
    a reciprocal transport assembly attached to the housing for pushing the circuit board dispensed onto the testing assembly laterally relative to its longitudinal axis into the modular testing component; and
    a sorting assembly attached to the housing for selectively directing the circuit board into a particular containment vessel based upon the outcome of the testing protocol;
    said testing assembly being adapted to eject the circuit board into the sorting assembly subsequent to the completion of the testing protocol.

2. The apparatus of claim 1 wherein said magazine assembly comprises:
    a singulator mechanism attached to the top surface of the housing; and
    an elongate sleeve releasably attached to the singulator mechanism, said sleeve being sized and configured to receive the circuit boards in stacked relation to each other;

said singulator mechanism being adapted to dispense the circuit boards stored within the sleeve onto the testing assembly one at a time.

3. The apparatus of claim 2 wherein the singulator mechanism comprises:
- a pair of singulator support blocks attached to the top surface of the housing in opposed relation to each other, said singulator support blocks being adapted to releasably receive the sleeve such that the sleeve extends upwardly from the top surface;
- a top pair of cylinders attached to respective ones of the singulator support blocks in opposed relation to each other, said top pair of cylinders having a top pair of reciprocal piston rods extending therefrom in coaxial alignment with each other;
- a top pair of blocks attached to respective ones of the top pair of piston rods;
- a bottom pair of cylinders attached to respective ones of the singulator support blocks in opposed relation to each other and in longitudinal alignment with respective ones of the top pair of cylinders, said bottom pair of cylinders having a bottom pair of piston rods extending therefrom in coaxial alignment with each other; and
- a bottom pair of blocks attached to respective ones of the bottom pair of piston rods.

4. The apparatus of claim 3 wherein the top pair of blocks each define:
- a top surface;
- a generally planar, vertically oriented front surface having top and bottom edges;
- a sloped transitional surface extending angularly between the top surface and the top edge of the front surface; and
- a retaining lip extending along the bottom edge of the front surface.

5. The apparatus of claim 3 wherein the bottom pair of blocks each define:
- a generally planar, vertically oriented front surface having top and bottom edges; and
- a retaining flange extending along the bottom edge of the front surface.

6. The apparatus of claim 3 wherein the top and bottom pairs of cylinders each comprise pneumatic cylinders.

7. The apparatus of claim 3 wherein the singulator support blocks are configured in a manner such that the sleeve is disposed at an angle of approximately ten degrees relative to an axis extending perpendicularly from the top surface when inserted into the singulator support blocks.

8. The apparatus of claim 3 wherein the singulator support blocks of the singulator mechanism are adjustably movable inwardly and outwardly relative to each other.

9. The apparatus of claim 1 wherein said transport assembly comprises:
- a pusher cylinder attached to the top surface of the housing and having a reciprocal piston rod extending therefrom; and
- a pusher plate attached to said piston rod and defining a bumping edge for contacting the circuit board dispensed onto the top surface.

10. The apparatus of claim 9 wherein the transport assembly further comprises a spacer sheet, said pusher plate being disposed upon and slidably movable along the spacer sheet.

11. The apparatus of claim 9 wherein said pusher cylinder comprises a pneumatic cylinder.

12. The apparatus of claim 1 wherein said testing assembly comprises:

- a shelf member pivotally connected to said housing and defining an upper surface, said shelf member being movable between a first position whereat said upper surface extends in generally parallel relation to the top surface of the housing and a second position whereat said upper surface slopes downwardly away from the top surface;
- an upper actuation bar pivotally connected to the housing;
- an upper actuation bar cylinder attached to said housing and having a reciprocal piston rod extending therefrom which is selectively engageable to the upper actuation bar;
- a lower activation bar pivotally connected to the housing;
- a lower actuation bar cylinder attached to said housing and having a reciprocal piston rod extending therefrom which is selectively engageable to the lower actuation bar; and
- a shelf cylinder attached to said housing and having a reciprocal piston rod extending therefrom which is attached to the shelf member.

13. The apparatus of claim 12 wherein said modular testing component comprises:
- an upper frame member;
- a lower frame member;
- a guide member disposed between said upper and lower frame members, said guide member including:
  - a pair of longitudinal locator slots sized and configured to receive the circuit board forced into the modular testing component by the transport assembly; and
  - a lower locator member disposed between said longitudinal locator slots for limiting the distance the circuit board is pushed into the modular testing component by the transport assembly;
- a test connector disposed between the guide member and the upper and lower frame members, said test connector including:
  - an upper cantilevered set of flexible, resilient testing fingers extending from between the guide member and the upper frame member; and
  - a lower cantilevered set of flexible, resilient testing fingers extending from between the guide member and the lower frame member;
- said upper actuation bar being movable between a loading position whereat the upper actuation bar extends laterally across the upper set of testing fingers and a testing position whereat the upper actuation bar flexes the upper set of testing fingers downwardly toward the top surface of the housing; and
- said lower actuation bar being movable between a loading position whereat the lower actuation bar extends laterally across the lower set of testing fingers and a testing position whereat the lower actuation bar flexes the lower set of testing fingers upwardly away from the top surface of the housing.

14. The apparatus of claim 12 wherein said modular testing component comprises:
- an upper frame member;
- a lower frame member;
- a guide member disposed between said upper and lower frame members, said guide member including:
  - a pair of longitudinal locator slots sized and configured to receive the circuit board forced into the modular testing component by the transport assembly; and
  - a lower locator member disposed between said longitudinal locator slots for limiting the distance the circuit board is pushed into the modular testing component by the transport assembly;

a test connector disposed between the guide member and the upper frame member, said test connector including a cantilevered set of flexible, resilient testing fingers; and said upper actuation bar being movable between a loading position whereat the upper actuation bar extends laterally across the testing fingers and a testing position whereat the upper actuation bar flexes the testing fingers downwardly toward the top surface of the housing.

15. The apparatus of claim 12 wherein said shelf member includes an ejector tab extending therefrom which is adapted to aid in the ejection of the circuit board from within the testing assembly during the movement of the shelf member from the first position to the second position.

16. The apparatus of claim 12 wherein the upper actuation bar, lower actuation bar and shelf cylinders each comprise a pneumatic cylinder.

17. The apparatus of claim 12 wherein the upper surface of the shelf member includes a sheet of low friction, anti-static material applied thereto.

18. The apparatus of claim 17 wherein said sheet is fabricated from polyethylene.

19. The apparatus of claim 1 wherein said sorting assembly comprises:

a pair of exit chutes attached to and extending from the housing;

a tilt tray pivotally connected to the housing, said tilt tray being moveable between first and second positions whereat the tilt tray is aligned with respective ones of the exit chutes; and a tilt cylinder attached to the housing, said tilt cylinder having a reciprocal piston rod extending therefrom which is pivotally connected to the tilt tray.

20. The apparatus of claim 19 wherein said tilt cylinder comprises a pneumatic cylinder.

21. A method for handling and testing circuit boards, comprising the steps of:

(a) providing a housing which defines a stationary top surface;

(b) dispensing the circuit boards onto a testing assembly attached to the housing one at a time, each of the circuit boards defining a longitudinal axis;

(c) pushing the circuit board dispensed onto the testing assembly laterally relative to its longitudinal axis into a modular testing component of the testing assembly;

(d) performing a testing protocol on the circuit board inserted into the modular testing component of the testing assembly;

(e) ejecting the circuit board from the testing assembly subsequent to the completion of the testing protocol; and (f) directing the ejected circuit board into a particular containment vessel based upon the outcome of the testing protocol.

22. The method of claim 21 further comprising the steps of:

(g) removing the modular testing component from the testing assembly; and (h) inserting an alternative modular testing component into the testing assembly.

23. The method of claim 21 wherein step (b) comprises the steps of:

(1) providing a magazine assembly which is includes a singulator mechanism attached to the housing and having an opposed, reciprocally movable top pair of blocks and an opposed, reciprocally movable bottom pair of blocks, and a sleeve releasably attached to the singulator mechanism;

(2) stacking a plurality of circuit boards into the sleeve such that the lowermost ones of the circuit boards contact the bottom pair of blocks;

(3) actuating the top pair of blocks toward each other so as to isolate a single circuit board between the top and bottom pairs of blocks;

(4) actuating the bottom pair of blocks away from each other so as to dispense the isolated single circuit board onto the top surface of the housing;

(5) actuating the bottom pair of blocks toward each other;

(6) actuating the top pair of blocks away from each other so as to cause the stacked circuit boards to drop into contact with the bottom pair of blocks; and (7) repeating steps (3)–(6).

24. The method of claim 21 wherein step (d) comprises the steps of:

(1) providing the modular testing component of the testing assembly with upper and lower cantilevered sets of flexible, resilient testing fingers;

(2) flexing the upper and lower sets of testing fingers into contact with the circuit board inserted into the modular testing component of the testing assembly; and (3) allowing the upper and lower sets of testing fingers to resiliently return to their unflexed orientations subsequent to the completion of the testing protocol.

25. The method of claim 21 wherein step (d) comprises the steps of:

(1) providing the modular testing component of the testing assembly with a cantilevered set of flexible, resilient testing fingers;

(2) flexing the testing fingers into contact with the circuit board inserted into the modular testing component of the testing assembly; and (3) allowing the testing fingers to resiliently return to their unflexed orientations subsequent to the completion of the testing protocol.

26. The method of claim 21 wherein step (e) comprises the steps of:

(1) providing the testing assembly with a shelf member which defines an upper surface and is pivotally movable between a first position whereat the upper surface extends in generally co-planar relation to the top surface and a second position whereat the upper surface slopes downwardly away from the top surface;

(2) actuating the shelf member from the first position to the second position subsequent to the completion of the testing protocol on the circuit board within the modular testing component of the testing assembly; and (3) actuating the shelf member from its second position back to the first position.

27. The method of claim 21 wherein step (f) comprises the steps of:

(1) providing a sorting assembly which is attached to the housing and includes a pair of exit chutes extending from the housing and a tilt tray which is pivotally movable between first and second positions whereat the tilt tray is aligned with respective ones of the exit chutes; and (2) actuating the tilt tray to one of the first and second positions depending upon the outcome of the testing protocol.

* * * * *

UNITED STATES PATENT AND TRADEMARK OFFICE
CERTIFICATE OF CORRECTION

PATENT NO. : 5,704,489

DATED : January 6, 1998

INVENTOR(S) : Paul E. Smith

It is certified that error appears in the above-identified patent and that said Letters Patent is hereby corrected as shown below:

Title Page, insert the following item:
  ---[60] Provisional application No. 60/011,621 filed
    February 14, 1996.----

Column 1, line 4, insert the following:
  ---CROSS REFERENCE TO RELATED APPLICATION
Reference is made to and priority claimed from U.S. provisional application Ser. No. 60/011,621, filed February 14, 1996, entitled SIMM/DIMM BOARD HANDLER.---.

Signed and Sealed this

Twenty-fourth Day of November, 1998

*Attest:*

BRUCE LEHMAN

*Attesting Officer*     *Commissioner of Patents and Trademarks*